United States Patent [19]
Chaudhari et al.

[11] 3,965,463
[45] June 22, 1976

[54] APPARATUS USING AMORPHOUS MAGNETIC COMPOSITIONS

[75] Inventors: Praveen Chaudhari, Briarcliff Manor; Jerome J. Cuomo, Bronx; Richard J. Gambino, Yorktown Heights, all of N.Y.

[73] Assignee: International Business Machines Corporation, Armonk, N.Y.

[22] Filed: May 27, 1975

[21] Appl. No.: 581,078

Related U.S. Application Data

[63] Continuation of Ser. No. 284,513, Aug. 29, 1972, abandoned.

[52] U.S. Cl. .................... 340/174 TF; 340/174 YC
[51] Int. Cl.$^2$........................................ G11C 11/14
[58] Field of Search ............................ 340/174 TF

[56] References Cited
UNITED STATES PATENTS
3,736,579  5/1973  Marsh .......................... 340/174 TF OTHER PUBLICATIONS
IEEE Transaction on Magnetics, vol. 8, Mag–8, No. 1, Mar. 1972, pp. 105–130.
Journal of Applied Physics, vol. 42, No. 1, Jan. 1971, pp. 367–375.

Primary Examiner—James W. Moffitt
Attorney, Agent, or Firm—Jackson E. Stanland

[57] ABSTRACT

Apparatus using amorphous magnetic compositions having uniaxial anisotropy include bubble domain apparatus, light modulating apparatus, permanent magnet systems, and tape and disc information handling systems. The amorphous magnetic composition can be prepared in thin film or bulk form or as particles in a binder. The anisotropy can be parallel to the plane of a film of this material or perpendicular to the film plane. The amorphous material is comprised of a single element or is a multicomponent system where as at least one of the components has an unimpaired spin so that the composition has a net magnetic moment. The amorphous composition exists as a microcrystalline structure having localized atomic ordering over a distance 25–100 A, or as a substantially amorphous structure where localized atomic ordering is over distances less than 25A. Binary and ternary compositions, either alloys or compounds, are suitable. The magnetic properties of the compositions can be changed during fabrication or after fabrication, and the compositions can be doped readily without adversely affecting magnetic properties.

63 Claims, 17 Drawing Figures

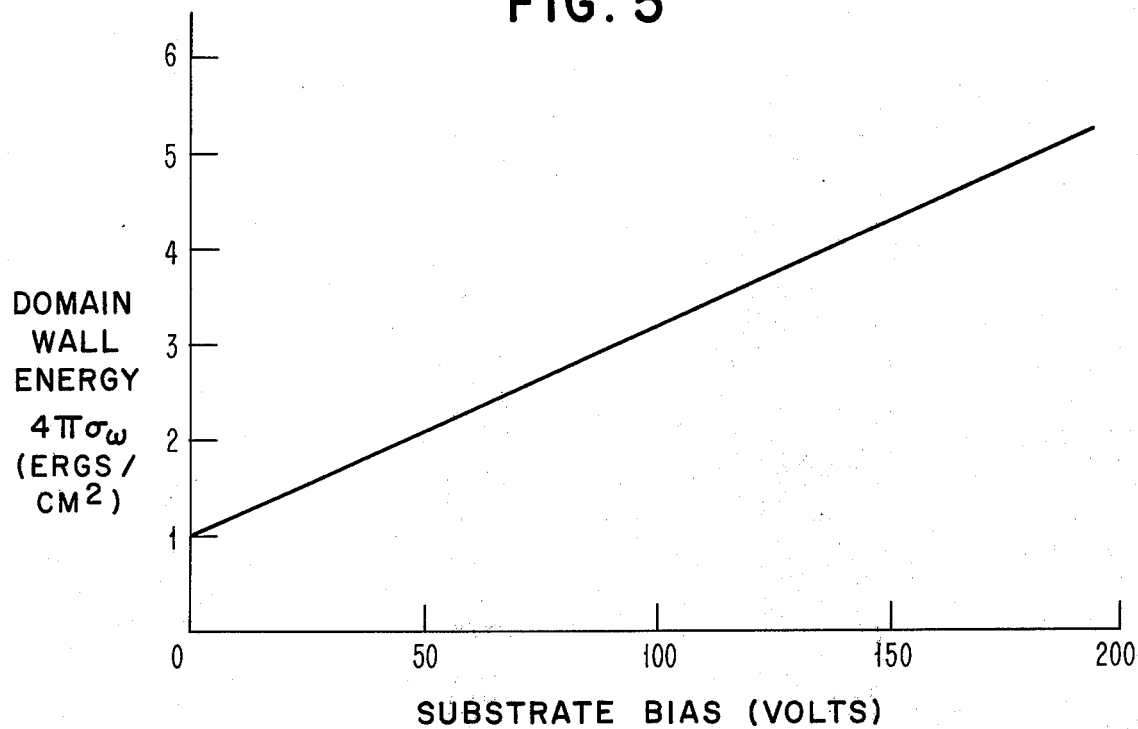
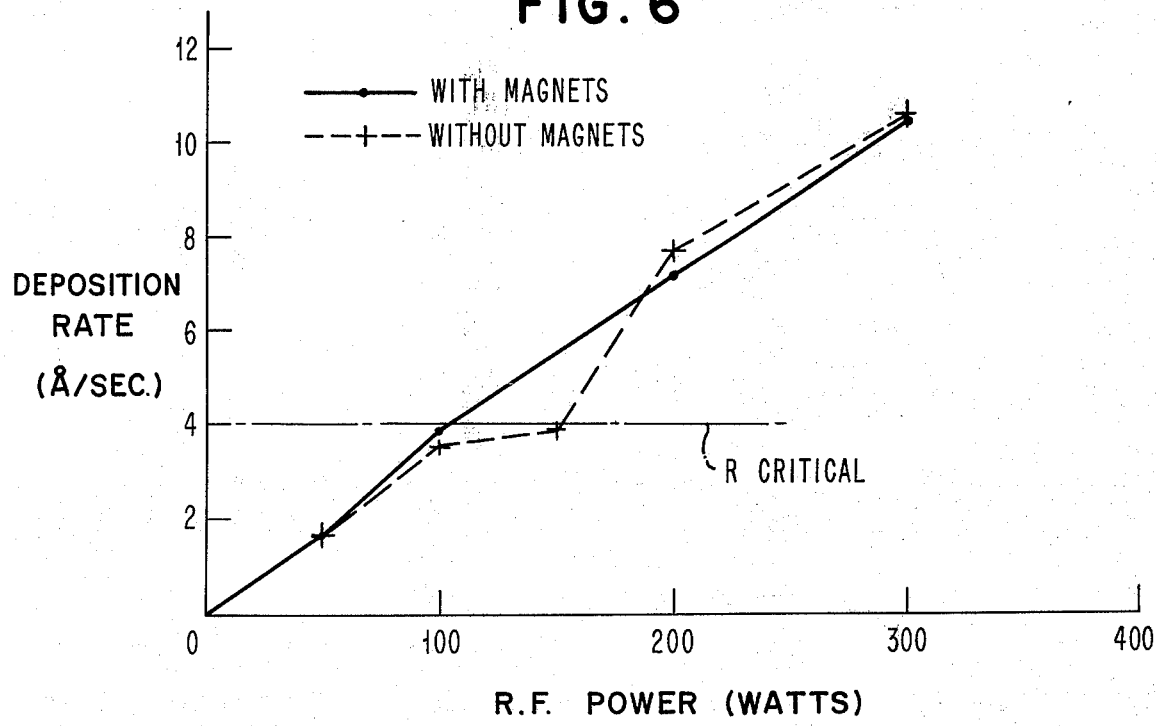

APPARATUS USING AMORPHOUS MAGNETIC COMPOSITIONS

This is a continuation of application Ser. No. 284,513 filed Aug. 29, 1972, now abandoned.

CROSS-REFERENCE TO RELATED APPLICATION

Ser. No. 284,512 filed the same day as the present application and assigned to the same assignee, describes a beam addressable information storage system using amorphous magnetic materials having uniaxial anisotropy.

BACKGROUND OF THE INVENTION

1. Field of the Invention

This invention relates to apparatus using substantially amorphous magnetic compositions having uniaxial magnetic anisotropy.

2. Description of the Prior Art

Amorphous materials are known in the art and can generally be classified as either metals or non-metals. The metals are described by either the Bernal model (where dense random packing exists) or by microcrystalline models. Amorphous metallic materials include Pd-Si and Mn-C alloys.

Non-metallic amorphous materials are generally covalently bonded and are exemplified by the "ovonic-type" materials. They are explained by random network models or by microcrystalline models in which the existence of atomic ordering is over distances less than 25A. Non-metallic amorphous materials are exemplified by $SiO_2$, Si, Ge, and Ge-Te alloys.

Non-metallic amorphous materials have been used for various applications including beam addressable information storage, as can be seen by referring to U.S. Pat. No. 3,530,441. However, the prior art does not show the use of amorphous magnetic materials having uniaxial anisotropy in applications such as magneto-optic devices and bubble domain systems. Additionally, the use of amorphous magnetic materials as permanent magnets is also not shown in the art. Such materials would be of value in a variety of applications such as this. For instance, amorphous materials can be deposited on any type of substrate and do not have to be lattice-matched with the substrate. Further, intrinsic substrate defects are not detrimental to the properties of the subsequently deposited amorphous material.

Additional advantages of amorphous materials include the fact that their compositions can be adjusted to optimize their properties without the restrictions imposed by compound stoichiometry That is, restrictions imposed by phase diagrams of materials to be combined are not present when amorphous materials are made. Additionally, amorphous materials can be prepared at low temperatures and fabricated by simple techniques such as evaporation, sputtering, etc.

Particularly with regard to magnetic amorphous materials, structural defects in the amorphous materials do not exist which would impede movement and nucleation of magnetic domains in the material. Also, these materials can have compositions which change over wide ranges to enhance selected magnetic properties. The addition of impurities to the composition will not affect the structural or magnetic properties in the films in an adverse way and can be used to obtain greater flexibility of composition design.

Amorphous films comprising multicomponent systems have been discussed in the literature. For instance, Sawatzky et al, *Journal of Applied Physics*, 42, 1, Jan. 1971, pg. 367, describes the kind of films which are amorphous when sputtered and then crystalline after an annealing process. In a related paper (*Material Science Research*, Vol. 4, pg. 493, 1969) E. Giess et al describes gadolinium iron garnet films having crystallite sizes between 30 and 50A. A ferromagnetic amorphous film comprising Fe-C-P alloy is described in Duwez et al, *Journal of Applied Physics*, 38, 10, Sept. 1967, p. 4096. The amorphous films described in these references do not exhibit uniaxial magnetic anisotropy.

Amorphous magnetic films of $Fe_xGd_y$ are described in J. Orehotsky et al, *Journal of Applied Physics*, 43, 5, May 1972, pg. 2413. In order to explain nonsaturation in these films, the authors proposed the existence of a perpendicular anisotropy associated with an isotropic stress in the plane of the film.

In the present invention, it has been discovered that uniaxial anisotropy can be produced in amorphous magnetic films and that anisotropy can be produced independent of substrate constraints. That is, uniaxial anisotropy can be obtained through pair ordering or through shape induced anisotropy. These amorphous compositions can be comprised of a single element or of a plurality of elements. Use of these amorphous magnetic compositions in device applications overcomes many of the disadvantages of prior art devices where crystalline magnetic material had to be used.

Accordingly, it is an object of the present invention to provide magnetic devices using substantially amorphous magnetic compositions.

It is another object of this invention to provide devices and systems using substantially amorphous magnetic compositions whose properties can be tailored over wide ranges.

It is still another object of this invention to provide magnetic bubble domain systems using amorphous magnetic materials for support of the magnetic bubble domains.

It is a still further object of this invention to provide magnetic bubble domain apparatus in which domains can be easily propagated without regard to structural defects or impurities in the material supporting the bubble domains.

It is a further object of this invention to provide magneto-optic systems using amorphous magnetic materials for modulation of light beams.

It is another object of this invention to provide devices using magnetic domains which can be fabricated easily and with reduced cost.

BRIEF SUMMARY OF THE INVENTION

Substantially amorphous magnetic compositions are prepared in either bulk or thin film form. Additionally, substantially amorphous magnetic particles can be prepared in a binder, for use on either tapes or discs. These compositions are comprised of a single element or multicomponent systems where at least one of the components has an unpaired spin. Thus, the compositions have a net magnetic moment and are magnetically ordered materials.

These substantially amorphous materials exhibit a uniaxial magnetic anisotropy which is not due to crystalline structure, which can be parallel or perpendicular to the plane of films formed of these compositions. Anisotropy arises by either of the following, or combinations of these: pair ordering, shape anisotropy, or stress induced anisotropy.

These amorphous compositions exist in a microcrystalline region where atomic ordering, if it exists, exists over the range of 25–100A. Additionally, substantially amorphous materials of the present invention exist having a structure where whatever atomic order is present over distances less than 25A.

Binary and ternary compositions are particularly suitable for the practice of this invention. These include both compounds and alloys, a suitable example being rare earth-transition metal compositions. For instance, Gd-Co alloys or Gd-Fe alloys are very usable.

The magnetic properties of these substantially amorphous compositions can be changed during fabrication by altering the fabrication process of the composition range of the constituents. Additionally, the magnetic properties of these compositions can be changed after fabrication and the films can be readily doped without adversely affecting magnetic properties. For instance, rare earth-cobalt and rare earth-iron amorphous compositions can be readily doped with oxygen, nitrogen, carbon, etc. to affect their magnetic properties.

These magnetic compositions can be used in a plurality of applications. For instance, if the anisotropy is perpendicular to the plane of the film, these films can be used in magneto-optic systems and in magnetic bubble domain systems. It is understood that the present substantially amorphous magnetic films will support magnetic domains therein, and in particular magnetic bubble domains. Additionally, these magnetic bubble domains can be propagated in the magnetic film using means which are identical to those well known in the art for movement of domains. Because amorphous films do not have to be prepared on carefully lattice-matched substrates, and because defects and impurities in the film do not impair domain propagation, the great advantages of substantially amorphous bubble domain materials are immediately evident. Further, since the magnetic properties of these amorphous films can be adjusted, they can be used as permanent magnetic bias layers in conjunction with magnetic bubble domain materials of the prior art type as well as with the amorphous magnetic bubble domain materials of the present invention.

Because the present amorphous materials can be prepared as magnetic particles in a suitable binder, immediate use in tape and disk applications is foreseen. Additionally, these amorphous films can be deposited on metallic or non-metallic substrates, including flexible substrates. Therefore, they can be used as storage media in information handling systems of any type.

The present amorphous materials can be used as light modulators in which the intensity of light passing through the amorphous film is affected by the presence and absence of a domain in the location in which the light spot is incident. A polarized light input will have its polarization rotated in accordance with the state of the amorphous material where the light beam strikes. An analyzer is used to detect whether or not a magnetic domain is present at the light spot in the amorphous film. Therefore, by selectively producing a magnetic domain in the amorphous film at the region of incidence of an input polarized light beam, the intensity of the beam received by a detector after passage through the amorphous film will vary, thereby providing a light modulator.

In general, the intensity of light passing through the amorphous film is affected by the fraction of the film area covered by domains magnetized in the direction of the light propagation. This fraction is easily controlled by an externally applied magnetic field, which is used to put domain magnetization in a preferred direction.

By altering the properties of this amorphous material, permanent magnet structures can be provided. These have utility as bias layers in magnetic bubble domain systems, as well as in areas where permanent magnet materials are required.

Additionally, it has been discovered that the amorphous compositions of the present invention can be used in beam addressable file applications if the magnetic properties of the amorphous compositions are changed. This is the subject of a co-pending patent application, Ser. No. 284,512, filed the same day as the present application in the name of P. Chaudhari et al, and assigned to the present assignee.

BRIEF DESCRIPTION OF THE DRAWINGS

FIG. 1A is an electron beam micrograph of the diffraction pattern of an amorphous magnetic composition of the present invention, while

FIG. 5 is a plot of domain wall energy ($4\pi\sigma_w$) as a function of the sputtering bias applied to the substrate during deposition of an amorphous magnetic alloy according to the present invention.

FIG. 6 is a plot of deposition rate versus applied RF power for sputtering amorphous magnetic alloys, showing the effect of applying a magnetic field of about 50 Oe during the deposition process.

DETAILED DESCRIPTION OF THE PREFERRED EMBODIMENTS

Amorphous Magnetic Compositions

Figure 1A:
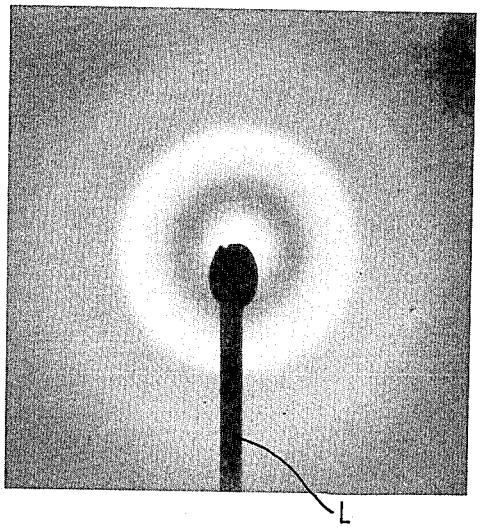

Substantially amorphous magnetic compositions exhibiting uniaxial anisotropy have been produced which are useful in many magnetic applications. These compositions can be produced in bulk or thin film form, or can be present as magnetic particles in a supporting binder. Since they are amorphous materials, the choice of substrate makes no difference, and factors such as lattice matching can be ignored. This leads to ease of deposition onto substrates of any type and greatly increases fabrication yields obtainable when materials of the present type are used.

These magnetic compositions can be comprised of a single element or a combination of elements present in a multi-component system. At least one of the components must have an unpaired electron spin so that the composition will have a net magnetic moment. That is, these are magnetically ordered (over a long range) materials.

These amorphous magnetic materials exhibit a uniaxial anisotropy which can be perpendicular or parallel to the plane of a film comprised of these amorphous magnetic compositions. The anisotropy arises from combinations of the following, or from any one of the following:
A. Pair ordering
B. Shape anisotropy
C. Stress induced anisotropy In the present invention, it is not important that uniaxial anisotropy be provided in any particular way.

These three mechanisms for production of uniaxial anisotropy in the substantially amorphous films of the present invention are generally known in the art and will not be discussed in great detail here. It is only sufficient to note that pair ordering involves the combination of two atoms whose magnetization is paired to form a net magnetic dipole. The magnetic pairs are aligned in certain directions which give rise to the uniaxial anisotropy required for use in magnetic devices.

Shape anisotropy arises because of the geometry of the magnetic regions. For instance, an ordered cluster of atoms in a region of a substantially unordered material will have a magnetization directed along the long axis of the atom cluster, since this axis will be preferred for alignment of magnetic moments. Along the short axis of the region defined by the cluster of atoms, strong demagnetizing fields exist.

Further, compositional variations in the amorphous material will produce phase separations which will give rise to this type of anisotropy. Phase separation includes both the situation of differing compositional regions located adjacent to one another and the situation of adjacent regions of the same composition having different structural phases (i.e., one region is amorphous while the other is more crystalline). As an example of phase separation, a Gd-Co amorphous magnetic alloy can be comprised of localized regions which are Co rich and other localized regions which are Gd rich. If these two regions are adjacent, this phase separation will produce uniaxial anisotropy.

Stress induced anisotropy arises from differences in the lattice parameters of the substrate and localized regions in the amorphous film, or because of differences of the thermal coefficients of the amorphous film and its substrate. This type of stress can also be a contributing factor to uniaxial anisotropy in substantially amorphous films of the present invention.

Amorphous magnetic compositions of the present invention exhibit microcrystallinity and/or substantially amorphous structure. Both of these structures differ from polycrystalline and single crystalline structures known in the prior art for magnetic compositions. For instance, the amorphous materials of the present invention may exhibit localized atomic ordering However, if this atomic ordering is present, it will exist over distances between 25 and 100A if the material is microcrystalline, or over distances less than 25A if the material is substantially amorphous. Of course, it is to be understood that there may be essentially no atomic ordering present in which case a substantially pure amorphous material will be provided.

Amorphous materials of the present invention can be comprised of single magnetic elements or multicomponent systems. Examples of the latter are binary and ternary alloys and compounds. Particularly suitable materials are compositions comprising rare earth elements and transition metal elements. Examples include Gd-Co, Gd-Fe, Y-Co, and La-Co, etc. These compositions can be adjusted over a wide range without the restrictions imposed by compound stoichiometry due to the phase diagrams of the constituents. Therefore, the magnetic properties of the materials can be tailored to whatever application is required. For instance, the composition ranges can be chosen such that the atomic moments of the rare earth element and the transition metal element nearly cancel, thereby obtaining a material with low saturation magnetization which would be of particular value as a bubble domain material.

These amorphous magnetic compositions exhibit long range magnetic ordering and have uniaxial anisotropy. In their simplest form, they are comprised of elements which in an elemental form carry a magnetic moment. Examples are the 4f series (rare earth elements) and the 5f series (the actinide elements). Also included are the iron group transition metals (3d series). Further included are elements which have a magnetic moment when in a particular state, exemplified by elements such as Mn, Cr, V, and Pd.

For any amorphous composition comprised of a single element, any non-magnetic element can be added to the composition in relatively small amounts without interfering with the magnetic properties. That is, dilution with non-magnetic elements (such as, O, C, P, and N) can be done without adversely affecting the magnetic properties. Therefore, it may be advantageous to add small amounts (generally, about 2 atomic per cent) of these non-magnetic elements in order to make the amorphous film more easily. Of course, if large amounts are added, magnetic properties are affected. For instance, amounts greater than about 50 atomic per cent will destroy long range magnetic ordering.

Binary compositions including at least one of the elements listed previously can also be used for the amorphous magnetic materials of the present invention. Binary compositions are generally easier to work with since they will retain their amorphous structure over wider temperature ranges than single element amorphous magnetic materials. As in the case of the single element amorphous material, small amounts of non-magnetic elements can be added to the composition.

Another change which can be made to binary amorphous compositions is to add a major concentration (2-50 atomic per cent) of non-magnetic elements to change the magnetic properties. For instance, copper can be added to dilute the magnetic moment.

Ternary combinations of the aforementioned $3d$, $4f$ and $5f$ elements can also be made to provide amorphous compositions having uniaxial magnetic anisotropy. As is the case with the binary elements, major concentrations of non-magentic elements can be added to change magnetic properties of these ternary compositions. Also, small amounts of non-magnetic materials can be added to more easily form amorphous films, without adversely affecting the magnetic properties. It should be understood that the amount of non-magnetic materials added is not sufficient to lose the long-range magnetic ordering in the amorphous film.

The amorphous magnetic materials of the present invention have long-range magnetic ordering and are either ferromagnetic, ferrimagnetic, or antiferromagnetic. Of course, it is this long range magnetic ordering which yields the uniaxial anisotropy present in these materials, which in turn makes them very useful for device applications.

The magnetic properties of these compositions can be changed during fabrication or after fabrication to suit particular applications. It has been determined that the magnetic properties are very dependent on the composition range of the constituents and also on the deposition conditions used to provide the composition. However, the dependency of magnetic properties on the deposition parameters is less than the dependency on the compositional ranges of the constituents. Processes such as annealing and ion implantation can be utilized after fabrication of these amorphous compositions to modify magnetic properties. Additionally, these magnetic materials can be doped with impurities and the structural magnetic properties of the films will not be adversely affected. Therefore, magnetic domain movement in the films will be not affected as is the case with conventional crystalline magnetic films. Examples of specific suitable amorphous magnetic compositions for a variety of applications will be presented in the specification and tables of materials and their properties will be presented at the end of the specification.

Depending upon the exchange interactions present in these materials, it may be possible to provide insulators, conductors and semiconductors which are substantially amorphous. In metals and semiconductors, the exchange interaction can be either direct, due to overlap of the atomic orbitals, or indirect due to the conduction electrons. These exchange mechanisms are not heavily sensitive to the long range atomic order of the system and are mechanisms which make amorphous materials suitable for magnetic applications. However, the exchange mechanism in insulators is generally super-exchange which is critically dependent on bond angle and distance. Since long range atomic order is absent in amorphous materials, these super-exchange requirements cannot be satisfied and long range magnetic order is not observed.

Figure 1B:
FIG. 1B is an electron beam micrograph of the diffraction pattern of the same material, after it has been annealed to give it a crystalline structure.

FIGS. 1A and 1B are electron beam micrographs which illustrate amorphous and crystalline materials. The electron beam diffraction pattern of FIG. 1A is characteristic of an amorphous material, while the diffraction pattern of FIG. 1B is characteristic of a crystalline material.

In more detail, FIGS. 1A and 1B were prepared by electron diffraction from a Gd-Co alloy. The solid line L in FIGS. 1A and 1B is used to block the incident electron beam in order to facilitate production of these photographs. The diffraction pattern of FIG. 1A is characteristic of an amorphous material.

FIG. 1B is an electron diffraction pattern of the material (Gd-Co) of FIG. 1A, after it has been crystallized by application of heat. In this case, the amorphous film of FIG. 1A was left in the electron beam microscope and was heated to approximately 300°C. The diffraction pattern of FIG. 1B is characteristic of that due to diffraction from a crystalline material. Both FIGS. 1A and 1B are of the same scale. These FIGS. illustrate the substantially amorphous characteristic of films made in accordance with the present invention.

Figure 2A:
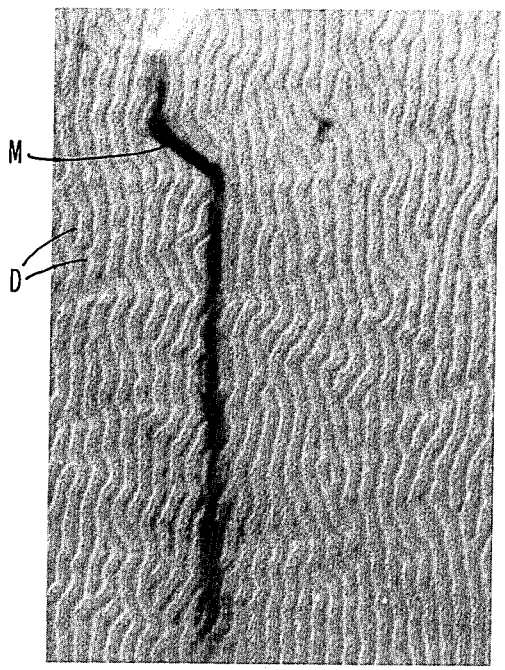
FIGS. 2A and 2B are photographs of magnetic stripe domains in the amorphous material of FIG. 1A, which illustrate the movement of the magnetic domains when a magnetic field is applied to the amorphous material.
Figure 2B:
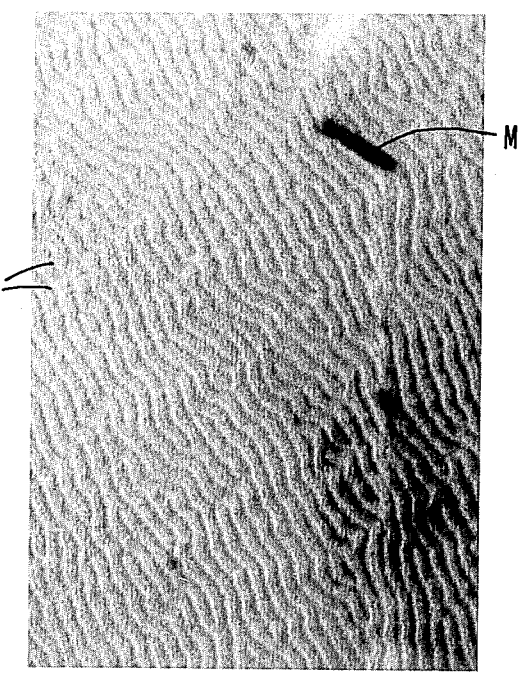

FIGS. 2A and 2B illustrate the presence of magnetic stripe domains in the amorphous material of FIG. 1A. In FIGS. 2A and 2B, a reference mark M has been scratched into the film to be used for determination of movement of the stripe domains when a magnetic field is applied to the amorphous material.

Referring more particularly to FIG. 2A, stripe magnetic domains D are clearly visible throughout the amorphous magnetic material. These stripe domains have walls generally oriented in a vertical direction in this figure. However, when a magnetic field is applied in the plane of the amorphous material, the stripe domains D are caused to tilt. This is apparent when the position of the domains D with respect to reference mark M is examined in these two FIGS. Thus, FIGS. 2A and 2B illustrate the existence of domains in the amorphous magnetic material and the movement of these domains by an applied magnetic field. As will be fully apparent later, the stripe domains D can be collapsed into circular bubble domains.

Amorphous films approximately 1 micron thick were deposited on NaCl, $SiO_2$, and $Al_2O_3$. These films exhibited uniaxial anisotropy and also had stripe domains. A perpendicular magnetic field of a few hundred oersteds was sufficient to collapse the stripe domains into circular bubble domains. Additionally, the bubble domains moved when the external magnetic field was moved. The domain pattern in the amorphous material was similar to domain patterns observed in carefully prepared garnet films. This suggests that the amorphous material has no local inhomogeneities which are sufficient to cause local pinning of domains which would restrict their movement. Of course, this is an advantage of an amorphous magnetic material where crystal structure defects do not exist, by definition. The nucleation and propagation of magnetic domains in such an amorphous material is not restricted by this class of defects.

Adjustment of Magnetic Properties

Depending upon the particular application in which these amorphous magnetic compositions are to be used, their magnetic properties are adjustable for optimum performance. Adjustment of magnetic properties in these amorphous materials is easily provided by techniques during fabrication of the amorphous materials and by processes utilized after the amorphous compositions are prepared. In contrast with prior art crystalline magnetic materials, the magnetic properties of amorphous films are generally easier to control than the corresponding properties in crystalline materials. One reason for this is that the compositional variations which are allowed in an amorphous material are far more extensive than the variations allowed in a crystalline material since amorphous compositions are governed by metastability, rather than by thermodynamic equilibrium. Various magnetic properties will now be individually discussed to illustrate the flexibility offered by amorphous materials.

Saturation Magnetization $M_S$

Magnetization $M_S$ is easily altered in an amorphous magnetic material by the addition of a magnetic atom which couples with a normally magnetic atom in the amorphous material, or an atom in the amorphous material which is magnetic in some state (for instance, Mn, Cr,... etc). To lower the magnetization $M_S$, the material added to the amorphous composition couples antiferromagnetically with the magnetic atom in the amorphous material. For instance, to lower the magnetization of the Gd-Co amorphous alloy, the Gd/Co ratio is adjusted so that their magnetic moments more nearly cancel.

To increase the magnetization of the amorphous material, magnetic atoms are added to the composition which couple ferromagnetically to the magnetic atom in the amorphous composition. For instance, the addition of Nd to an amorphous composition of Gd-Co will increase the magnetization of the composition. As another example, the addition of Co to an amorphous composition of Y-Co will increase the magnetization.

These additions are added during the fabrication process and are done in the following way: A mixture of the constituent elements in melted and cast into a disc shaped ingot which is used as a target for sputtering. The composition can be adjusted during the target fabrication or the composition of the film can be varied during the sputtering process by adjusting the bias voltage on the substrate in order to preferentially re-sputter a fraction of one or more of the constituents. Alternatively, a second target of the additive element can be provided in the sputtering system so that one of the additive elements is introduced into the deposited film.

When thin films are fabricated by vacuum evaporation, the concentration of the additive can be varied in the evaporation source or a supplemental source of the additive element can be provided.

Figure 3A:
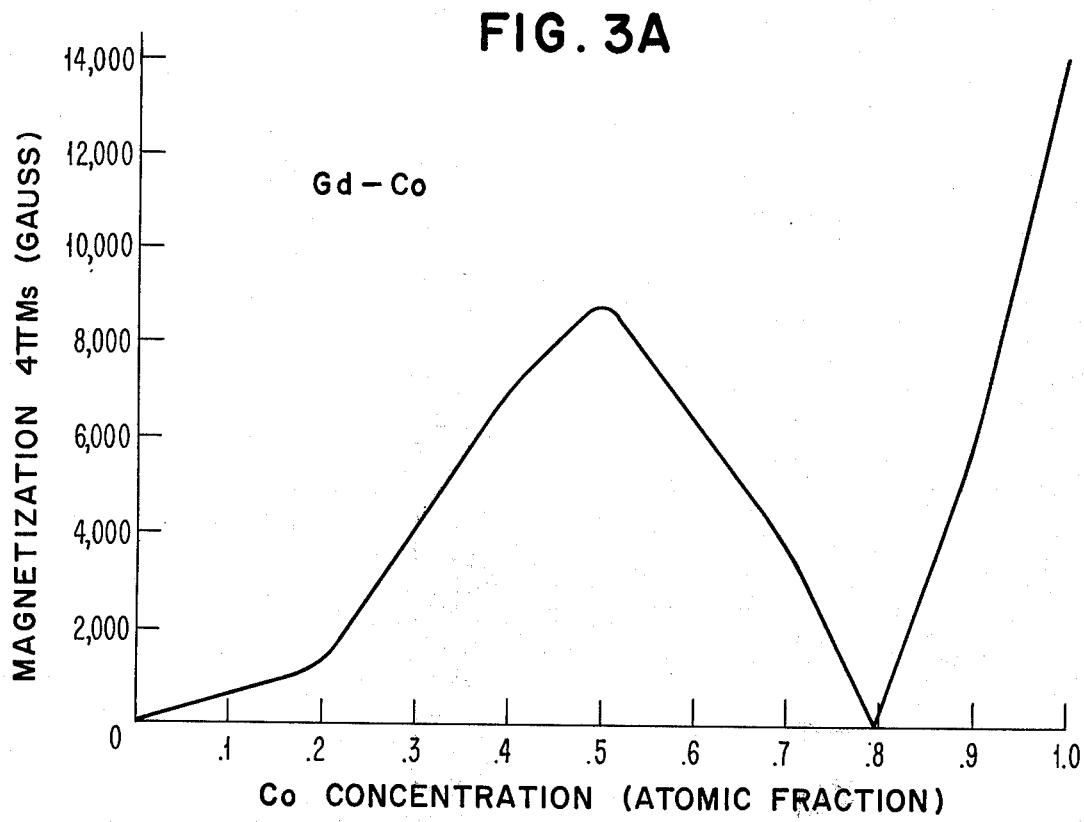
FIG. 3A is a plot of magnetization $4\pi M_s$ versus the concentration of cobalt in a Gd-Co amorphous alloy.

FIG. 3A is a plot of magnetization $4\pi M_S$ at room temperature as a function of the concentration of cobalt in a Gd-Co amorphous alloy. From this plot, it is apparent that the amount of magnetic atom Co in the amorphous alloy determines the magnetization of the alloy. Accordingly, magnetization of this alloy is shifted by additions of material to the amorphous alloy which change the Gd/Co ratio and thus the degree to which their magnetic moments cancel.

The composition region near the magnetization minimum is particularly suitable for low magnetic moment materials with high Curie points. Because the low magnetization of compositions near 79 atomic per cent cobalt results from a cancellation of the Gd and Co moments rather than from dilution effects, the Curie point, which is largely determined by Co-Co interactions, is not affected. Consequently, the magnetization of the material at room temperature can be changed while still keeping $T_c$ within specified ranges.

Another way to change the magnetization of an amorphous alloy is by adding small amounts of $N_2$ when the amorphous alloy is being sputtered. For instance, when sputtering Gd $Co_5$ in argon, addition of small amounts of $N_2$ (approximately 1 volume per cent $N_2$ in the argon gas) causes stripe domains in the material to decrease markedly in size. This in turn indicates an increase in $4\pi M_S$. That is, the antiferromagnetic coupling of the Gd and Co is affected such that the magnetization is increased without destroying the uniaxial anisotropy of the amorphous material. The nitrogen bonds with the Gd thereby weakening the antiferromagnetic coupling between the Gd and the Co. The moment of the Co sublattice is less effectively cancelled by that of the Gd sublattice so the magnetization increases.

Figure 3B:
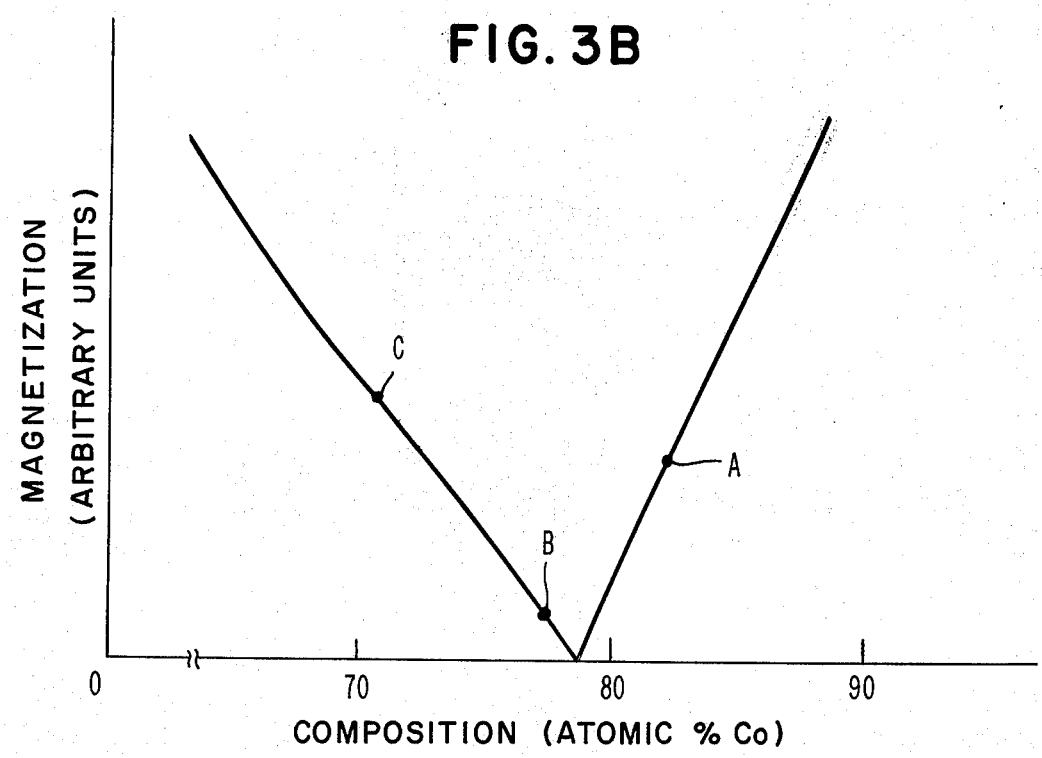
FIG. 3B is another plot of magnetization $4\pi M_s$ versus composition for a Gd-Co amorphous alloy, which is used to indicate the shift in magnetization which occurs when dopants are added to the amorphous material.

FIG. 3B is a plot of magnetization $M_S$ in arbitrary units vs composition for a Gd-Co amorphous alloy, also in arbitrary units. There is a minimum in magnetization at some composition of Gd-Co.

If the Gd-Co composition is normally at composition A and the composition is prepared with $N_2$ present, a shift in magnetization occurs as if an increase in cobalt composition were occurring. Therefore, higher magnetization is provided. If, on the other hand, one started with a composition at C and added nitrogen to the deposition system, the film produced would shift in magnetization toward a minimum. Therefore, magnetization $M_S$ can be shifted by simple additions of $N_2$ to the material to change the exchange interaction between the constituents of the composition to a higher or lower magnetization, according to where one is on the magnetization vs composition curve for that material.

Coercivity $H_c$

Coercivity in magnetic material is a primary factor in determining the ease with which magnetic domains move in the material. Adjustments to coercivities usually involve adjustments of the grain size of the magnetic material, since coercivity is dependent upon grain size. Generally, the coercivity is a maximum for some value of grain size and diminishes for grain sizes less than and greater than that which gives the highest coercivity. For instance, coercivity is high in magnetic materials in which the grain size approaches the domain wall width.

Grain size can be influenced by adding dopants such as $N_2$ and $O_2$. These additives change the ordering in the amorphous film so that it is different than (or the same as) the domain wall width ($\delta$). If $\delta >$ the ordering, $H_c$ is low while if $\delta \simeq$ the ordering $H_c$ is maximum.

Ion implantation to a selected depth is generally suitable, as it is not desirable to unduly heat amorphous materials. Heating beyond certain temperatures causes amorphous materials to change to a crystalline state, which may not be a reversible state. Annealing to crystallize the amorphous film to provide grains of the desired size can also be used.

Other methods for influencing coercivity involve surface treatment such as sputter etching and ion etching to roughen the structure of the surface. This in turn will influence the movement of domains in the amorphous magnetic material.

Curie Temperature $T_c$

These amorphous magnetic materials are easily alloyed to change the Curie temperature without adversely influencing the structure of the materials. Additionally, there is no limitation imposed by a phase diagram as would be the case for crystalline material. Alloy ranges over large amounts (approximately 50 atomic percent) can be used as long as the uniaxial anisotropy of the material is not affected. Generally, the Curie temperature will scale linearly with the amount of magnetic atoms present. The Curie temperature in these amorphous materials is easier to control than in crystalline magnetic materials.

Alloying conditions are used to change the Curie temperature of the amorphous magnetic material. For instance, for a Gd-Co amorphous alloy, the addition of lower moment magnetic atoms such as Ni, Cr, Mn or non-magnetic atoms such as Cu, Al, Ag, Pd, Ga, In, etc. will lower the Curie temperature, while the addition of an element such as Fe will increase the Curie temperature. The strength of the magnetic interaction (coupling) in the material is changed by the added elements.

Faraday Rotation $\phi_F$

Increased Faraday rotation or Kerr rotation of a light beam incident upon the amorphous magnetic material is achieved by providing amorphous material having a high magnetic moment. Rare earth dopants, such as Tb, Dy, Ho can be added to the amorphous material, or alloying additions can be added to the material. For instance, in the case of the Gd-Co amorphous alloy, increasing the amount of Co will increase the Faraday rotation. Also, additions of Fe to the material will also increase the Faraday rotation. For high Faraday rotation, it is desirable that the magnetization $4\pi M_s$ have as high a value as possible (for instance, 8000 – 10000 gauss).

Characteristic Length (l parameter)

The l parameter is a quantity particularly useful in the design of magnetic bubble domain systems. For a more detailed discussion of this parameter, reference is made to A. A. Thiele, *J. Appl. Phys.*, 41, 1139 (1970).

Figure 4A:
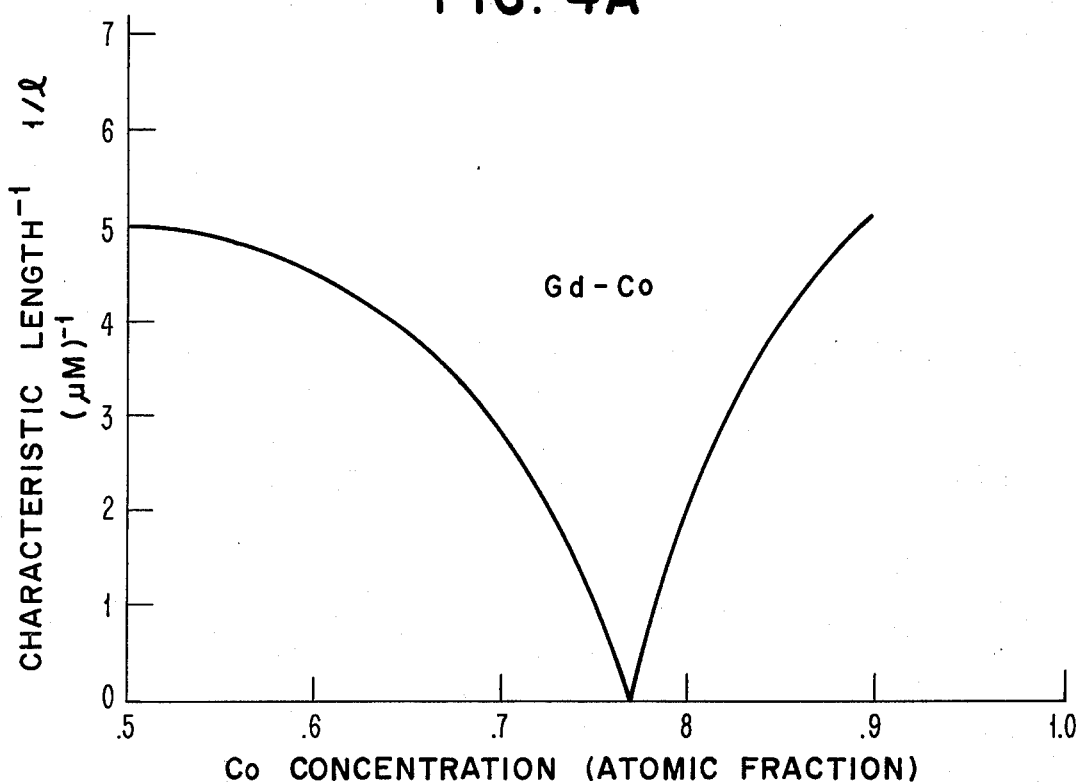
FIG. 4A is a plot of inverse characteristic length $[K_u/4\pi(1/l)]$ versus cobalt concentration in a Gd-Co amorphous alloy.

The l parameter is very dependent upon the range of constituents in the amorphous alloy. For instance, FIG. 4A shows the variation in l parameter (more specifically, $(K_u/4\pi)(1/l)$) versus the concentration of the magnetic ion in an amorphous magnetic alloy. In this particular case, the composition is Gd-Co and the horizontal axis is the Co concentration. From this, it is readily apparent that the l parameter can be varied by changing the composition of the amorphous alloy. The plot of FIG. 4A was obtained for various compositions of Gd-Co where all fabrication parameters were held constant for each sample. The same compositions fabricated under different conditions have different values of l parameter. Because the compositional range of an amorphous material can be varied easily over wide limits, in contrast to the situation for a crystalline magnetic material, it is relatively easy to vary the l parameter.

Figure 4B:
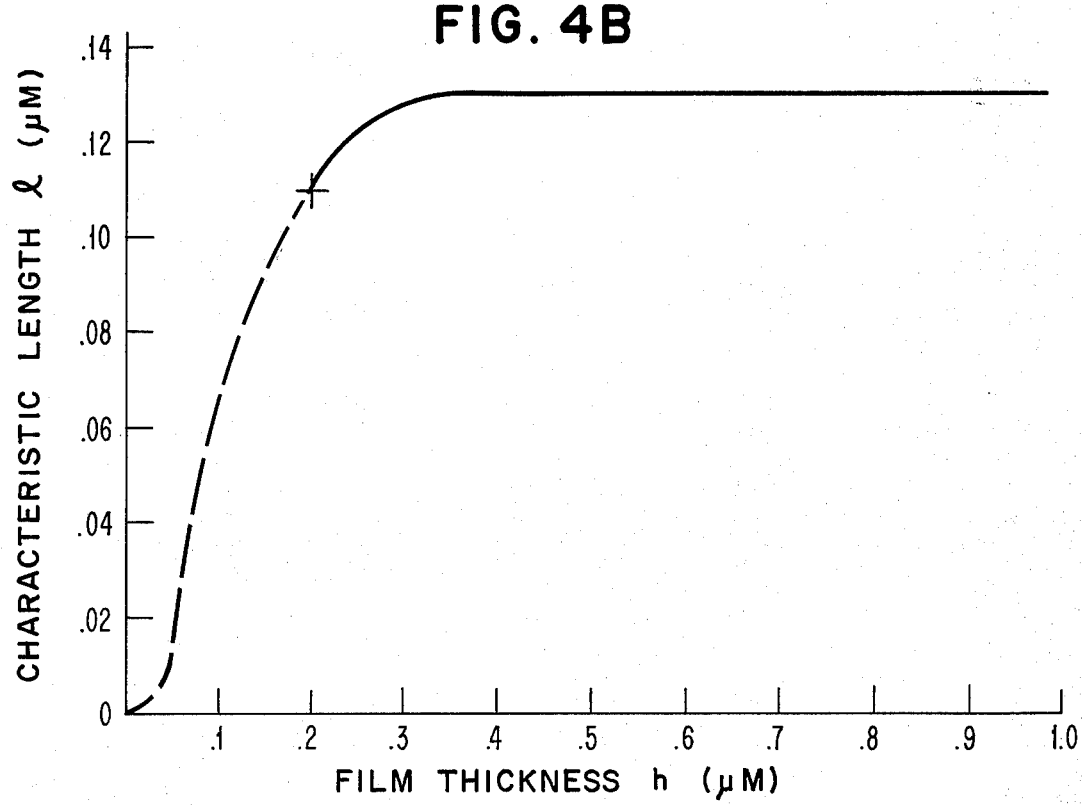
FIG. 4B is a plot of characteristic length l versus the thickness of an amorphous magnetic film in accordance with the present invention.

FIG. 4B shows the dependence of the l parameter on the thickness h of the amorphous magnetic film. Below a critical thickness for each composition sufficient perpendicular anisotropy to support bubble domains will not be obtainable so the curve is shown as a dashed line below the critical thickness. For the particular composition plotted here (Gd 20 atomic per cent, Fe 80 atomic per cent), a thickness of 0.2 microns will yield sufficient perpendicular anisotropy to support bubble domains.

Domain Wall Energy $\sigma_w$

The domain wall energy $\sigma_w$ is related to the l parameter of the amorphous material. The domain wall energy is also directly proportional to the $\sqrt{AK_u}$, where A is the exchange constant of the material and $K_u$ is the uniaxial perpendicular anisotropy constant of the material.

FIG. 5 is a plot of the domain wall energy $4\pi\sigma_w$ in ergs/cm² measured as a function of the substrate bias used while sputtering amorphous Gd-Co alloys containing 80–85 atomic per cent Co. This substrate bias is a voltage on the substrate measured with respect to ground. In the DC sputtering apparatus used to provide the curve in FIG. 5, approximately 2000 volts were applied between the anode and the cathode to cause deposition of the amorphous Gd-Co. Use of substrate bias provides control of the composition and magnetic properties of the deposited amorphous material. In this manner, the domain wall energy can be varied over a wide range.

The domain wall energy can also be changed by varying the exchange constant A or the anisotropy $K_u$. Exchange constant A represents the strength of the magnetic coupling in the material and is proportional to Curie temperature $T_c$. Consequently the constant A will change from one material to another. Changes in anisotropy are discussed in a later section of the specification.

Anisotropy $K_u$

The anisotropy of the material can be varied by varying the process used to make the amorphous composition. For instance, the deposition rate is a determining factor as is the thickness of the deposited film. In general, $K_u$ is function of the material composition and growth conditions. These factors will be discussed more fully in the section dealing with fabrication techniques.

Domain Size and Domain Wall width $\delta$

The domain wall width is equal to $\sqrt{A/K_u}$ where A is the exchange constant of the material and $K_u$ is its anisotropy. As was mentioned previously, anisotropy $K_u$ depends upon the thickness of the amorphous film and upon the deposition rate. Therefore, domain wall width $\delta$ can be varied by changing anisotropy $K_u$. This in turn is a function of the composition of the amorphous film, its range of constituents, and the deposition process used to make the amorphous material. In the section on fabrication techniques, curves will be shown for the variation of anisotropy $K_u$ with film thickness and deposition rate.

The domain size is a function of the characteristic length l and the thickness of the film. Generally, the domain size is chosen so that device performance is optimal. For magnetic bubble domain systems, the characteristic length l is given by the following relationship.

$$l = \sigma_w/4\pi M_s^2$$
$$= \frac{\sqrt{AK_u}}{4\pi M_s^2}$$

Consequently, the characteristic length, and therefore the domain size, can be varied by varying magnetization $M_s$, anisotropy $K_u$, and exchange constant A.

The exchange constant is a quantity representing the strength of magnetic coupling within a given material. It is proportional to the Curie temperature and will be larger for materials which have larger Curie temperatures $T_c$. As explained previously, the anisotropy $K_u$ is a function of the material composition and growth conditions used to obtain the material. Magnetization $M_s$ results from magnetic spins and their alignment (either parallel or antiparallel). This quantity is temperature dependent and can be varied by varying the amorphous film composition and the growth parameters used for providing the amorphous film. Therefore, the domain size can be varied readily over wide ranges.

Fabrication of Amorphous Magnetic Materials

These materials can be fabricated in bulk form, or as thin films. In general, any known film deposition technique can be utilized including sputtering and evaporation.

To form a bulk film of amorphous magnetic material splat cooling may provide a useful technique. In this method, a hot liquid of the film constituents is incident on a cool surface where the constituents solidify to form an amorphous bulk film. This provides a rapid quenching from the liquid phase.

Uniaxial anisotropy can be induced in bulk films by subjecting them to bombardment by energetic atomic particles in an applied magnetic field or by annealing them in a magnetic field at a temperature below their crystallization temperature. Another method for providing bulk films is to continuously evaporate them, using the techniques described below.

Fabrication of thin amorphous films in accordance with the present invention can utilize deposition from a vapor, rapid quenching from a liquid phase, or ion implantation for adjustment of anisotropy. In general, these amorphous films are dependent upon the rate of deposition of atoms onto the substrate, the temperature of the substrate, and the angle of incidence of atoms depositing on the substrate. If the incoming atoms are not able to get into some equilibrium site, the tendency to form amorphous films will be increased. In this context, reference is made to S. Mader, *The Use of Thin Films in Physical Investigations*, edited by J. C. Anderson (Academic, New York, 1966) p. 433. Also, see U.S. Pat. No. 3,427,154 which discusses the fabrication of amorphous thin films.

In order to favor pair ordering as a means of obtaining uniaxial anisotropy in these films, it appears to be important that the depositing atoms strike the substrate at a non-normal angle of incidence. That is, the incoming atoms should have some component of velocity parallel to the substrate surface in order to achieve uniaxial anisotropy in the film. This "glancing angle" gives the atom mobility parallel to the substrate which in turn favors pair ordering, since the incoming atoms can move around and choose an atomic site which lowers the energy of the system through the demagnetizing fields of the material. Phase separation is favored which will lead to shape anisotropy because clusters of similar atoms will group together at a site in which the energy of the system is lowered. This in turn leads to compositional groupings which, as explained previously, will lead to anisotropy in the film.

Another factor in achieving uniaxial anisotropy is the deposition rate of incoming atoms. If the deposition rate is too high, incoming atoms cannot move around greatly on the substrate surface, thereby limiting mobility parallel to the substrate. In this regard, reference is made to FIG. 6 which is a plot of deposition rate in angstroms per second versus RF power used in a sputtering system for deposition of amorphous materials. In this case, the amorphous magnetic material is Gd-Co. In FIG. 6, there is a critical deposition rate of 4 angstroms per second for a given substrate temperature and target composition. That is, at 4 angstroms per second deposition rate, Gd-Co samples (containing about 80 atomic percent Co) exhibiting domain patterns were obtained which were characteristic of a uniaxial perpendicular anisotropy in the amorphous magnetic alloy of Gd-Co.

In FIG. 6, deposition was made with a magnetic field (50 Oe) normal to the substrate, and without the magnetic field present, in order to determine the effect of magnetic fields during deposition. The effect of the magnetic field was not great although it did improve the sputtering efficiency somewhat.

As the substrate bias used in the sputtering system increases, the anisotropy generally increases. This is because the bias causes incoming atoms to be loosened from the surface of the depositing film by resputtering. Consequently, the atoms have more mobility parallel to the substrate surface which enables them to achieve preferred sites leading to compositional grouping or pair ordering.

Figure 7:
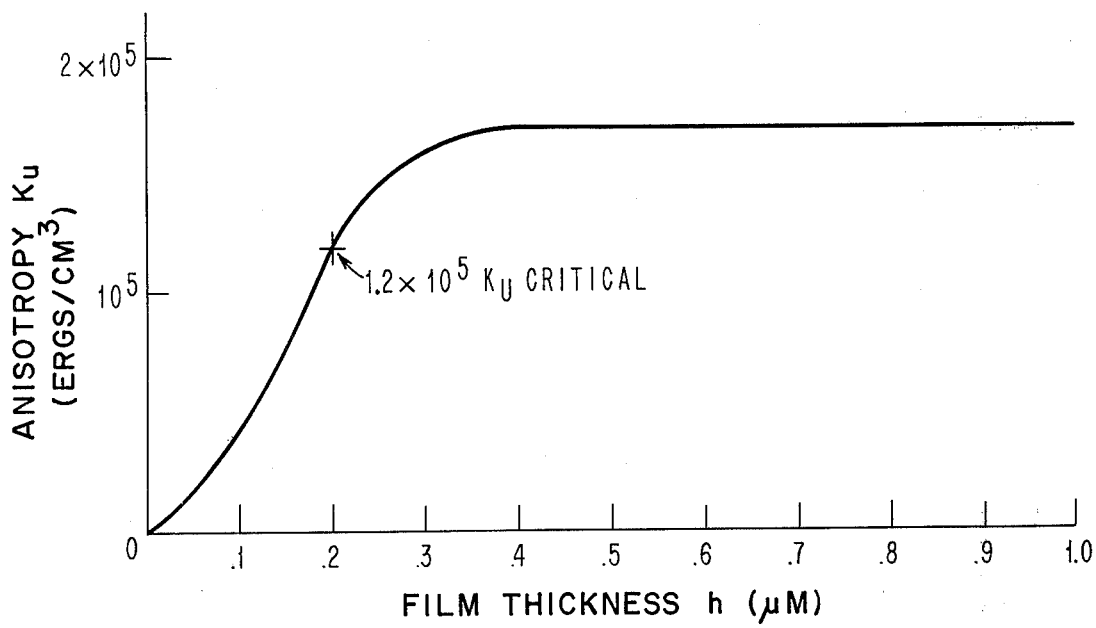
FIG. 7 is a plot of anisotropy $K_u$ of an amorphous uniaxial magnetic film versus the thickness of the magnetic film.

FIG. 7 is a plot of anisotropy $K_u$ (ergs/cm$^3$) plotted as a function of the thickness h of the amorphous magnetic film, measured in microns. For this film of GdFe amorphous material, a critical anisotropy of about $1.2 \times 10^5$ ergs/cm$^3$ is required for support of domains therein as expressed by the stability condition $K_u \geq 2\pi M_s$. This critical anisotropy occurs at a film thickness 0.2 microns.

For the deposition of amorphous magnetic materials, the substrate temperature is kept relatively low. These films can be deposited at room temperature or less and generally are deposited at a temperature less than that which would cause crystallization of the materials. For instance, for Gd-Co amorphous materials an upper limit for substrate temperature is approximately 300°C, the crystallization temperature.

Figure 8:
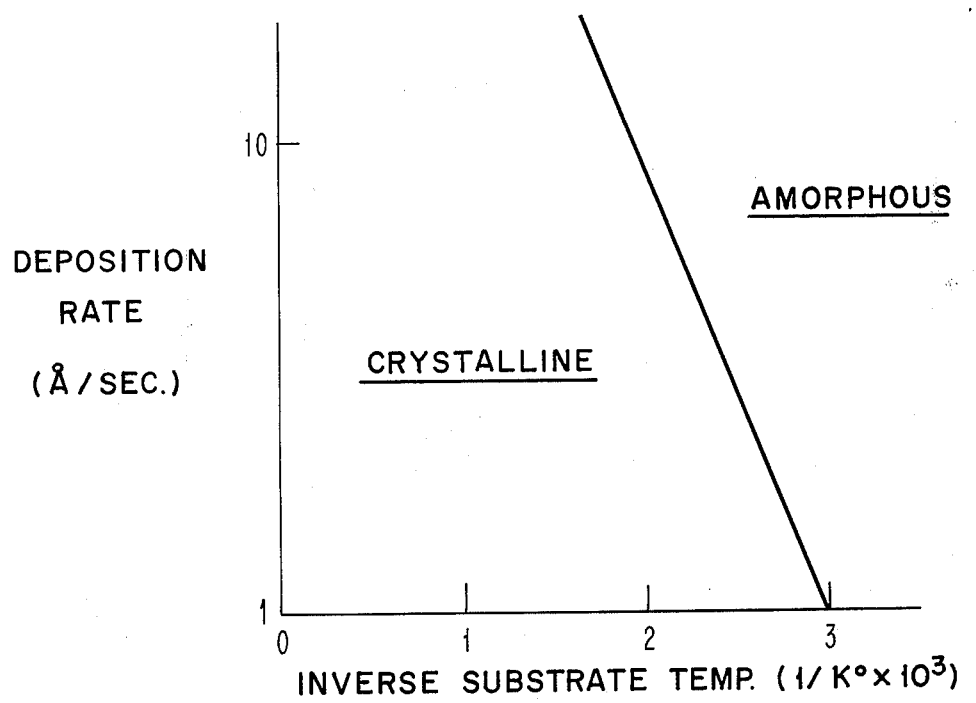
FIG. 8 is a plot of deposition rate (on a log scale) versus inverse substrate temperature illustrating the amorphous-crystalline transformation which occurs at certain deposition conditions.

FIG. 8 is a plot of deposition rate (plotted on a log scale) versus substrate temperature for Gd-Co and Gd-Fe alloys. From this plot, it can be seen that amorphous magnetic films can be produced over a wide range of substrate temperatures depending upon the deposition rate. Generally, no matter what deposition rate is used, the substrate temperature must be less than that at which crystallization occurs in order to provide amorphous magnetic materials in accordance with the present invention.

Stress induced anisotropy can also be used to provide the subject amorphous magnetic materials. This type of anisotropy can be used together with the other methods (pair ordering, etc.) for obtaining anisotropy, or can be used by itself. For stress induced anisotropy, the substrate is chosen to couple to the magnetostriction of the deposited film such that anisotropy will be provided in the amorphous film. In more detail, if the film is deposited at some temperature other than room temperature and if the film and substrate have different coefficients of thermal expansion, the film will experience a net stress at room temperature.

As was mentioned previously, many substrates can be used. Since the restraints of crystallographic matching do not exist for the production of amorphous films, the choice of substrates is unlimited. These substrates can be any known materials including metals and insulators, as well as semiconductors. Non-rigid substrates, such as plastics, can also be used. In the TABLES to follow, numerous substrates will be mentioned.

Films which have in-plane anisotropy can be changed to films having perpendicular anisotropy by annealing the films. For instance, annealing Gd-Co films at about 300–400°C will switch an in-plane anisotropy to a perpendicular anisotropy. Of course, as the film thickness increases, the likelihood of perpendicular anisotropy also increases. for instance, Gd-Co films of thickness at least 2000A generally exhibit perpendicular anisotropy.

Applications for Uniaxial Amorphous Magnetic Materials

The amorphous magnetic materials of the present invention can be used for a plurality of applications including use in bubble domain systems, beam addressable files (the subject of aforementioned copending application Ser. No. 284,512, light modulators, permanent magnets, and as recording media on tapes and discs. Each of these applications will now be considered and the parameters of interest in each will be detailed.

Bubble Domain Systems

In magnetic bubble domain systems, it is important that the quantity $4\pi M_s$ be low and that the material exhibit a uniaxial, perpendicular anisotropy. Additionally, the quality factor $Q = H_a/4\pi M_s$ should be greater than 1, where $H_a$ is the uniaxial anisotropy magnetic field and $M_s$ is the saturation magnetization of the material. Additionally, the coercivity $H_c$ of the material should be low in order to be able to easily move the bubble domains and to nucleate and collapse them within the amorphous magnetic material. Since the quality factor Q should be greater than 1 to obtain stable bubble domains, systems with low magnetization are generally used, since it is difficult to obtain very high induced anisotropy fields $H_a$. In ferromagnetic systems, it is possible to lower the magnetization $M_s$ by dilution with a non-magnetic element, but because the magnetic Curie temperature scales with magnetization, suitably low $4\pi M_s$ values can only be obtained in alloys with operating temperatures close to the Curie temperature.

Low magnetic moments with high ordering temperatures such that the amorphous materials are suitable for devices operated at room temperatures are obtained in a ferrimagnetic system which consists of two or more kinds of magnetic atoms with their spins opposed. This type of ordering is obtained in amorphous alloys of rare earth elements — first transition metals. Amorphous alloys of rare earth elements — transition metal elements (such as $Gd_xCo_y$) having appropriate composition are obtained in which the atomic moments of the rare earth element and the transition metal element nearly cancel, thereby leading to a material with a suitably low $4\pi M_s$ value. Suitable examples are Gd-Co alloys having 70–90% Co and Gd-Fe amorphous alloys having 70–90% Fe. In thin film form, the anisotropy is induced by either stress or by pair ordering, or by shape anisotropy, as was described previously.

As was mentioned, low coercivity $H_c$ is generally required for bubble domain material. Correspondingly, the bubble domain wall width $\delta$ should be such that on an average it sees the same average potential well everywhere within the amorphous material. The quantity $\delta$ should be approximately equal to or slightly greater than the type of atomic order which is found in the amorphous material. If local fluctuations (phase separations, grain size, etc.) in the amorphous material are smaller than the wall width $\delta$, their effect on the motion of the domain wall is negligible. Further, microcrystallites of 25–100 angstrom ordering are not necessarily detrimental to domain motion. Until the grain size of the amorphous material approaches the wall width $\delta$, the coercivity $H_c$ is low.

The domain wall width $\delta$ scales according to the Curie temperature $T_c$ since the exchange constant A scales with $T_c$ ($\delta\sigma_w=A$). Consequently, if large wall widths are desired, it is necessary to provide large exchange constants. However, the wall width $\delta$ should not be too large since the anisotropy energy will increase having an adverse effect on mobility. Generally, for amorphous bubble domain material it is desirable that a low wall energy $\sigma_w$ be obtained, which means that materials with low Curie points $T_c$ should be used. As was mentioned previously, amorphous magnetic materials can be readily alloyed to change $T_c$. The constraints on Curie temperature $T_c$ for amorphous bubble domain materials are essentially the same as for crystalline bubble domain materials. However, it is easier to control Curie temperature $T_c$ in an amorphous magnetic material than it is in a crystalline magnetic material.

The choice of substrate is optional when amorphous magnetic bubble domain materials are used. Suitable substrates include semiconductors, insulators, and metals, as for example NaCl, glasses, $SiO_2$, Si, Ge, GaAs, and $Al_2O_3$. One particularly suitable amorphous magnetic film was comprised of $GdCo_5$ which was sputtered onto an NaCl substrate. This sputtering was from an arc cast target of Gd-$Co_5$ in which the substrate was a water cooled (approximately 20°C) substrate having gallium backing to insure thermal contact with the cooling block. Serpentine domains were observed by electron microscopy in a film approximately 750A thick. The presence of ferrimagnetic ordering was confirmed by heating the sample through the compensation point to disorder the Gd ordering at which point in-plane domains were observed. Perpendicular domains were restored by cooling to room temperature. The electron diffraction pattern was characteristically that of an amorphous material. These magnetic serpentine domains having perpendicular magnetization were seen in a free standing film which had been floated off the NaCl substrate, thereby indicating that the anisotropy was not stress induced and was most likely that of the pair ordering type.

Films approximately 1 micron thick were deposited in a separate run but under the same fabrication conditions on substrates of NaCl, $SiO_2$, and $Al_2O_3$. These films also showed serpentine domains when observed by Bitter patterns and by the Kerr effect. A perpendicular magnetic field of few hundred oersteds was sufficient to collapse the serpentine domains into circular domains. By moving the external magnetic field, the domains would move in the amorphous magnetic film. This domain pattern was similar to those observed in carefully prepared garnet films, which suggests that the amorphous material has no local inhomogeneities which would be sufficient to cause local pinning of domains. Of course, this is an advantage of amorphous materials where crystal structure defects, by definition, do not exist. Magnetic bubble domains and their movement are not restricted by this class of defects.

Figure 9:
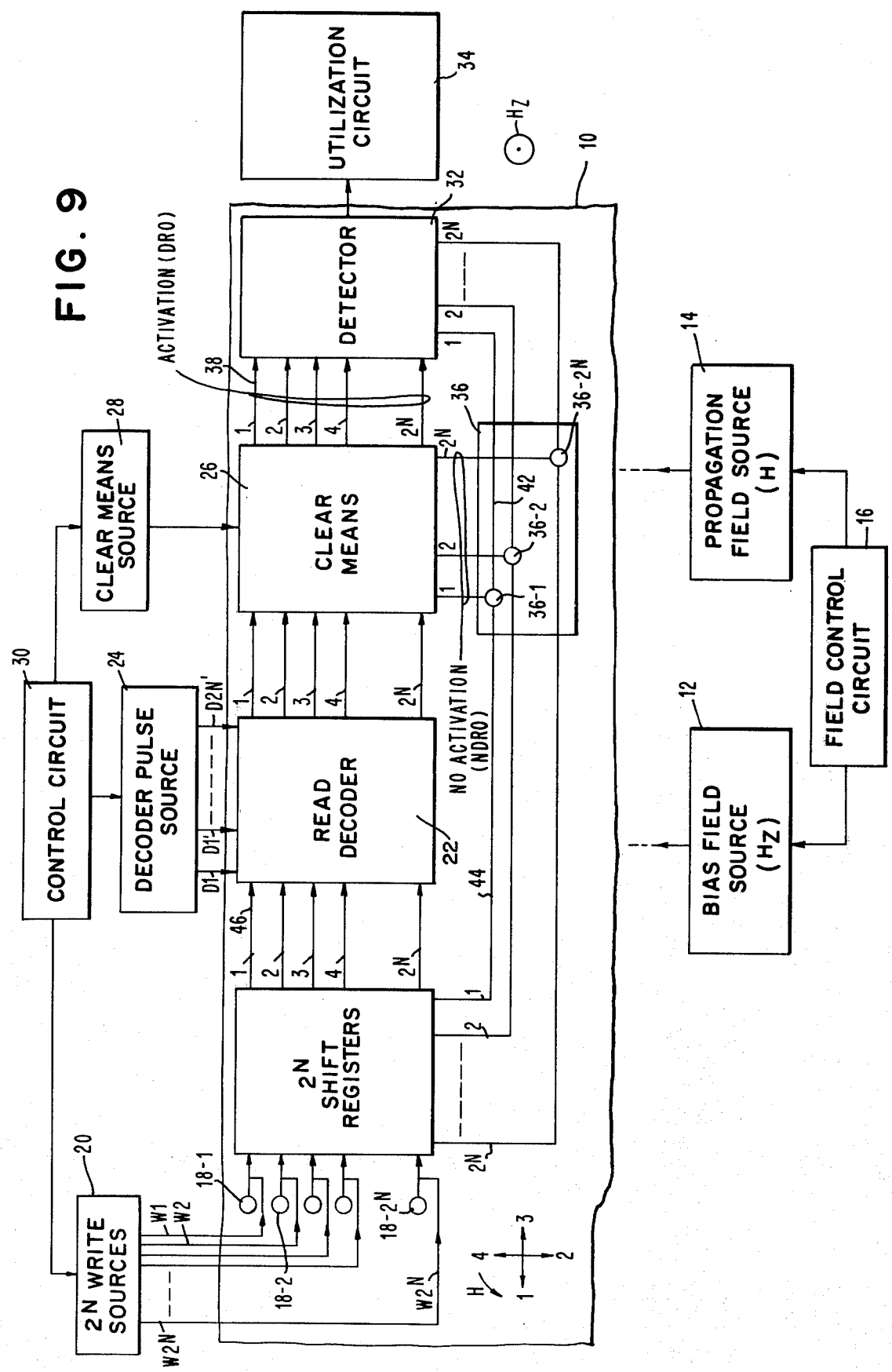
FIG. 9 is an illustration of a magnetic bubble domain system using the amorphous magnetic materials as the bubble domain material.
Figure 10:
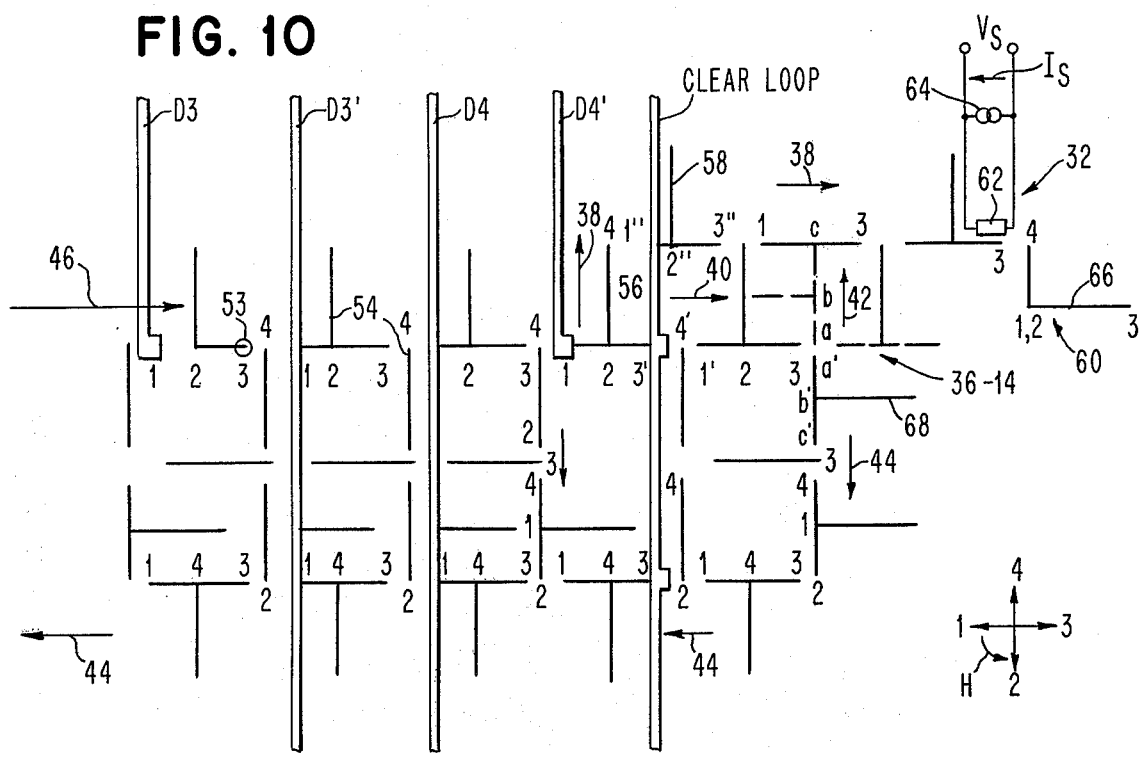
FIG. 10 is a detailed illustration of a portion of the circuitry shown schematically in FIG. 9.

FIG. 9 shows a magnetic bubble domain system in which an amorphous magnetic material 10 is used as the medium which supports magnetic bubble domains therein. FIG. 10 is a diagram of a portion of the circuitry in the decoders shown in FIG. 9. The magnetic bubble domain system of FIGS. 9 and 10 is identical to that described and claimed in copending application Ser. No. 158,232, filed June 30, 1971 in the name of H. Chang, et al and assigned to the present assignee (now U.S. 3,689,902). Because the embodiment of FIGS. 9 and 10 is used only to illustrate a bubble domain environment in which the present amorphous magnetic materials can be used, that system will not be described in great detail, reference being instead made to copending application Ser. No. 158,232. The following is a brief explanation of that bubble domain system, using an amorphous material for the magnetic medium 10.

In FIG. 9, a block diagram of a memory system using cylindrical magnetic domains (bubble domains) which provides writing, storage, decoding, clearing, and sensing is shown. The amorphous magnetic sheet 10 is comprised of one of the compositions mentioned previously. A suitable example is a Gd-Co amorphous alloy or Gd-Fe amorphous alloy. The properties of the amorphous film required for use in a bubble domain system have already been described. The magnetic sheet 10 has a bias magnetic field $H_z$ normal to its plane for maintaining the diameter of cylindrical magnetic domains in magnetic sheet 10. Bias field $H_Z$ is provided by a bias field source 12, which can be an external coil. If desired, the bias field can be provided by a permanent magnet layer or by a second magnetic sheet exchange-coupled to the magnetic sheet 10.

When domains are to be moved by attractive magnetic poles created by soft magnetic elements located adjacent magnetic sheet 10, a propagation field H is provided by propagation field source 14. Propagation field H is a re-orienting magnetic field in the plane of magnetic sheet 10 which establishes attractive and repulsive magnetic poles along the soft magnetic elements located adjacent to magnetic sheet 10. Propagation field source 14 is comprised of external coils located around magnetic sheet 10 which are alternately pulsed to provide a magnetic field in any desired direction. In FIG. 9, the propagation field H is a rotating magnetic field which can be directed along any of the directions 1, 2, 3, and 4.

While the bubble domain environment will be explained particularly in terms of a propagation means comprising soft magnetic elements, it will be readily understood by those skilled in the art that other propagation means, such as conductor loops, can be used as well. The bias field source 12 and propagation field source 14 are activated by the field control circuit 16, which provides current to the sources 12 and 14 for establishing the bias field $H_Z$ and the propagation field H.

Domains move in closed paths in each of the $2^N$ shift registers. The domains are representative of binary information, the presence of a domain being indicative of a binary 1 while the absence of a domain is indicative of a binary 0, for instance. Associated with each shift register 1, 2, ..., $2^N$ is a domain generator 18-1, 18-2, ... 18-$2^N$. These generators write information into the shift registers in accordance with the inputs provided by the write pulse sources 20 on lines W1, W2, ... W$2^N$. If desired, a write decoder can be used with domain generators 18-1, etc. to insert information into selected shift registers, as is shown in copending application Ser. No. 103,046, filed Dec. 31, 1970 in the name of H. Chang et al, and assigned to the present assignee, now U.S. Pat. No. 3,701,125.

A read decoder 22 is associated with the shift registers. The read decoder receives 2N inputs derived from a decoder pulse source 24. Depending upon the inputs supplied to read decoder 22, any or all of the $2^N$ shift registers can be selected for information readout.

After selection by the read decoder 22, information in the selected register passes through a clear means 26 which is activated by a clear means source 28. The clear means source 28, decoder pulse source 24, and write pulse sources 20 are under selective control of control circuit 30, which provides inputs to each of these sources to activate them at the proper time. Clear means 26 sends the domains in the selected shift register into one of two paths, depending upon whether the information is to be read out destructively or non-destructively. If destructive readout is to be used, domains in the selected register are passed directly to detector 32, which could be a magnetoresistive sensing element, an inductive loop, a mangeto-optic sensing device, or any other means of detection. Associated with the detector is a domain collapser which destroys the domains. The output of the detector 32 goes to the utilization means 34, which can be any external circuitry using the binary information contained in the selected shift register.

If non-destructive readout is desired, the clear means 26 will direct the domains from a selected register to a domain splitter 36-1, or 36-2, ..., 36-$2^N$. The splitter divides input domains into two portions, one of which travels to the detector 32 for destructive readout while the other travels back to the selected shift register for continued circulation in that shift register loop.

In FIG. 9, the shift registers, read/write decoder 22, and clear means 26 are shown as separate, distinct components for ease of understanding, but it should be understood that the decoder, having a clear means, is integrated into the shift registers. Consequently, the lines 46 and 44 represent the shift register loops 1, 2, ..., $2^N$ which are intersected by the decoder 22 which includes the clear means 26.

The block diagram of FIG. 9 shows a complete cylindrical domain memory system in which information is selectively written into $2^N$ shift registers for storage therein. The information content of the shift registers can be selectively addressed by inputs to the read decoder 22. Then, depending upon the activation of clear means 26, domains in selected registers will be destructively or non-destructively read. If destructive readout is indicated by the clear means, domains in selected registers are destructively read out by a detector 32. During destructive readout, a control circuit 30 activates the write pulse source 20 which in turn activates the domain generators 18-1, 18-2, ..., 18-$2^N$ associated with the register which is destructively read. Thus, new information is written into the destructively read shift register.

If the clear means indicates that information is to be non-destructively read from the selected shift register, the domains from that shift register are directed to a domain splitter where they are divided into two new domains. One of the new domains goes to detector 32 for destructive readout, while the other is brought back to the selected shift register for continued circulation in that shift register.

Selection of any or all shift registers for destructive or non-destructive readout is possible in accordance with the binary inputs applied to the read decoder. In FIG. 10, a portion of one shift register (SR14) of FIG. 9 is shown, for illustration of the decoding and clearing functions. The magnetic sheet is not shown.

Domains, such as 53, travel to the right in the direction of arrow 36 in this shift register (SR14). It is to be understood that most of this shift register loop is not shown, and that the loop extends further to the left, to accommodate decoder loops D1-D2' (FIG. 9) and to provide sufficient storage. in accordance with well known principles, the rotating propagation field H creates attractive poles in T and I bar permalloy elements 54 for movement of domains in the direction of arrow 46. Deposited on magnetic sheet 10 and over selected permalloy elements 54 are conductors used for decode loops D3, D3', D4, and D4'. Also deposited on magnetic sheet 10 and on the appropriate permalloy elements 54 is the clear loop CL, which is also a conductor loop (such as copper). As is apparent, decode loops D3 and D4' have widened portions in the areas where they intersect T bar elements in path 46, while decode loops D3' and D4 do not have widened portions where they pass T bar elements in path 46. This means that currents in decode loops D3' and D4 will not affect the passage of domains along path 46.

Also deposited on magnetic sheet 10 is a permalloy domain splitter 36-14 which in this case comprises a top permalloy overlay and a bottom permalloy overlay, which is shown in dashed lines. Operation of a permalloy splitter of this type is described in aforementioned Ser. No. 103,046.

Using binary inputs 1 0 1 0 0 1 1 0 for decoder inputs D1, D1',...,D4' for selective readout of this shift register, no current is present in decode loops D3 and D4'. As mentioned previously, currents in decode loops D3' and D4 do not influence operation of shift register 14. Consequently, domains 53 propagate in the direction of arrow 46 to pole position 2 of T-bar 56. After this, domain 53 will either follow the path indicated by arrow 38 or the path indicated by arrow 40. If clear loop CL is activated by a current pulse, no attractive magnetic pole will be created at pole position 3' of element 56. Therefore, domains located at pole position 2 of element 56 will be attracted upwardly to pole position 4 of element 56 when propagation field H is in direction 4. After this, the domains will move to pole position 1'' on T-bar 58 when propagation field H is in direction 1. Movement in the direction of arrow 38 will continue as H rotates, bringing domains to detector 32 for destructive readout.

Detector 32 is shown conveniently as a magnetoresistive detector in conjunction with a domain buster 60. Magnetoresistive sensing detector 32 is comprised of a magnetoresistive sensing element 62 and a constant current source 64. As explained in copending application Ser. No. 78,531, filed Oct. 6, 1970 and assigned to the present assignee, (now U.S. Pat. No. 3,691,540) the magnetization vector of sensing element 62 will be rotated when the stray magnetic field of a domain 53 interacts with it. This will cause a resistance change in sensing element 62, which is manifested as a voltage signal $V_s$.

Domain buster 60 comprises an elongated permalloy pattern 66 to which domains 53 travel after being sensed when H rotates to direction 4, domains 53 move to pole position 4 on element 66. As H rotates, domains 53 move to the corner of element 66, and are trapped there even when H rotates to directions 2 and 3, since pole position 3 is far from the corner of element 66. When H is in position 3, the localized field at the corner becomes repulsive, and domains collapse.

If no current pulse exists in clear loop CL when domains 53 are located at pole position 2 of element 56, these domains will propagate along the path indicated by arrow 40 as propagation field H rotates. Thus, the domains will be brought to domain splitter 36-14. As mentioned previously, this splitter comprises a top permalloy overlay indicated by the solid T and I bars and a bottom permalloy overlay indicated by the dashed elements. Under the action of the rotating propagation field H, domains 53 which enter splitter 36-14 are divided into two portions. One portion travels towards detector 32 via the bottom overlay following attractive poles a-b-c (in the direction of arrow 42). After this, these domains follow path 38 to the detector.

The other portion of the split domain moves to sequential pole positions a'-b'-c' on element 68 as propagation field H rotates. These domains follow the path indicated by arrows 44 for recirculation in shift register 14.

Consequently, this bubble domain system provides memory and logic functions on a single sheet of amorphous magnetic material. The various components which can be used with prior art bubble domain materials can also be used here. In the present case, amorphous magnetic materials are easily provided on any type of substrate, and can have selected thicknesses and lateral dimensions.

Although permalloy patterns have been shown for propagation of domains, it is readily understood that conductor loop patterns could also be provided, as could angelfish wedge patterns. Further, the writing means and the sensing means could be varied without departing from the concept outlined in this invention.

Light Modulation

Because the amorphous magnetic materials of the present invention will support magnetic domains therein, it is possible to provide a light modulator which modulates the intensity of an input light beam. In this application, it is desirable to have high magnetic movement $4\pi M_s$, low coercivity $H_c$, high Curie temperature $T_c$, and further, the anisotropy field $H_A$ should be greater than the magnetic moment $4\pi M_s$. This is conveniently satisfied in amorphous materials such as Y-Co, La-Co, Ce-Co, Nd-Co, and Pr-Co.

Since magnetic domains in a sheet of amorphous magnetic material will have their magnetization either parallel or anti-parallel to the direction of the input light beam, the light beam will be affected differently depending upon the direction of magnetization of the area of the magnetic sheet which the beam strikes. With input polarized light, the rotation of the polarization will be different depending upon magnetization direction of these domains, and therefore the intensity of the light beam passed through the amorphous magnetic material can be changed by changing the direction of magnetization of the domains.

Figure 11:
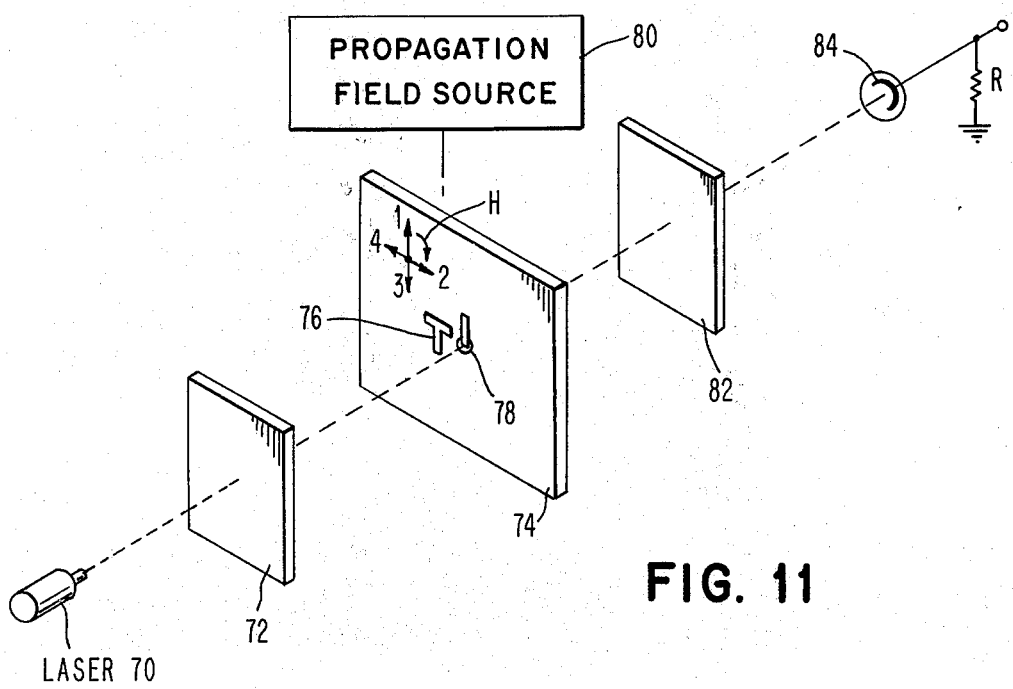
FIG. 11 is a magneto-optic light modulator using the present amorphous magnetic materials as the light modulating medium.

FIG. 11 shows a light modulator in which a laser 70 produces a beam of light which travels to polarizing element 72 before striking amorphous magnetic material 74. Located adjacent film 74 is a domain propagation means generally designated 76. In this case, propagation means 76 is comprised of T and I bar elements which provide attractive magnetic poles for movement of a domain 78 in sheet 74, in accordance with the orientation of propagation magnetic field H, produced by propagataion field source 80. After passage through amorphous sheet 74, the light beam strikes analyzer 82 before being detected by photocell 84.

Depending upon the presence or absence of a domain 78 where the light beam strikes amorphous sheet 74, the polarization of the light beam will be rotated differently. For one rotation of the polarization the light beam will be able to pass through analyzer 82 and strike photocell 84, thereby producing a current through resistor R. In the other case, the rotation of polarization of the light beam will be such that it will not pass through analyzer 82 and no voltage will be detected across resistor R. Thus, a light intensity modulator is provided by a suitable sheet of amorphous magnetic material having domains therein.

In FIG. 11, it should be understood that the light can be made to reflect from amorphous sheet 74 rather than propagating through it. In either case, the effect is the same; that is, the light will have its polarization affected differently depending upon the direction of magnetization of the domains at the location of incidence of the light beam.

Permanent Magnet

The amorphous magnetic materials of the present invention can be used as permanent magnets. In this case, it is desirable that the magnets have high coercivity $H_c$, high magnetic movement $4\pi M_s$ and high Curie temperature $T_C$. Suitable compositions include Y-Co doped with oxygen, nitrogen, or carbon.

A particularly suitable application for a permanent magnet layer using an amorphous material is that of a bias layer adjacent to a magnetic sheet in which bubble domains exist. The magnetic sheet supporting the bubble domains can be a crystalline magnetic sheet or an amorphous magnetic sheet in accordance with the present invention. In contrast with crystalline permanent magnet materials which depend upon crystalline properties for high bias fields, the present amorphous permanent magnets are easily fabricated with selected properties, in accordance with the considerations previously described.

Figure 12:
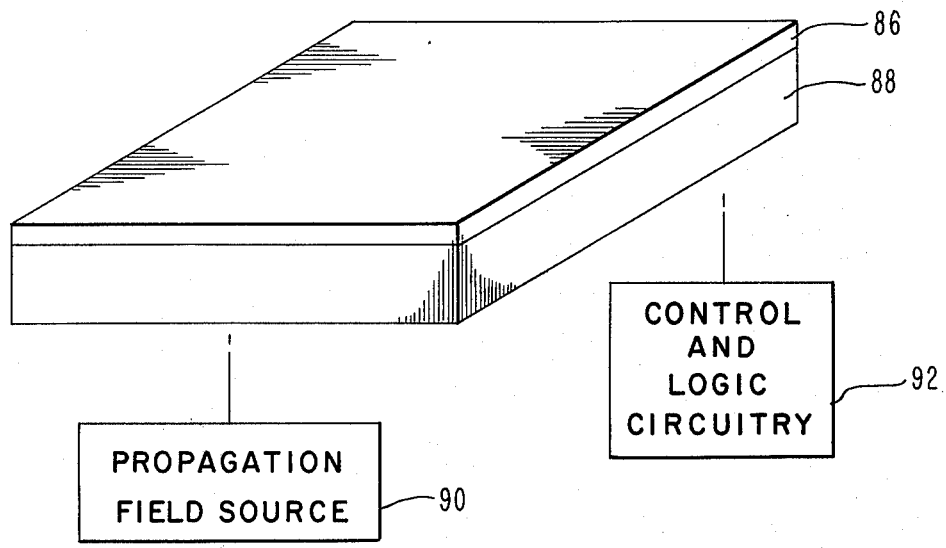
FIG. 12 is an illustration of a magnetic bubble domain material having adjacent thereto a layer of amorphous magnetic material which functions as a bias layer for magnetic domains in the bubble domain material.

FIG. 12 shows the use of an amorphous permanent magnet layer 86 used to provide bias for a magnetic bubble domain sheet 88. A propagation field source 90 and control and logic circuitry 92 are provided for manipulation of domains in bubble domain material 88. The bubble domain material 88 could be a known material having garnet structure [such as $(Eu,Y)_3(Ga,Fe)_5O_{12}$] or an amorphous material in accordance with the present invention. In fabricating the embodiment of FIG. 12, it is not critical that crystalline properties be maintained throughout, since amorphous materials do not follow the constraints required for fabrication of crystalline compositions.

Of course, the general structure comprising an amorphous magnetic film on a substrate of any kind is also illustrated by FIG. 12. In this general case, the structure can have any use and the layer 86 is an amorphous magnetic film according to the present invention, and the sheet 88 is any suitable substrate, such as a semiconductor, insulator, or metal. Additionally, the substrate can be flexible or rigid, and means can be provided for moving the amorphous magnetic film/substrate combination.

Recording Subsystems

It is possible to deposit the present amorphous magnetic material as a recording material onto a substrate, such as a semiconductor, insulator, or metal. The substrate can be tapes or discs. Additionally, this amorphous magnetic material can be prepared as magnetic particles in a binder (such as a conventional resin-type binder) to be used on any type of substrate.

Figure 13:
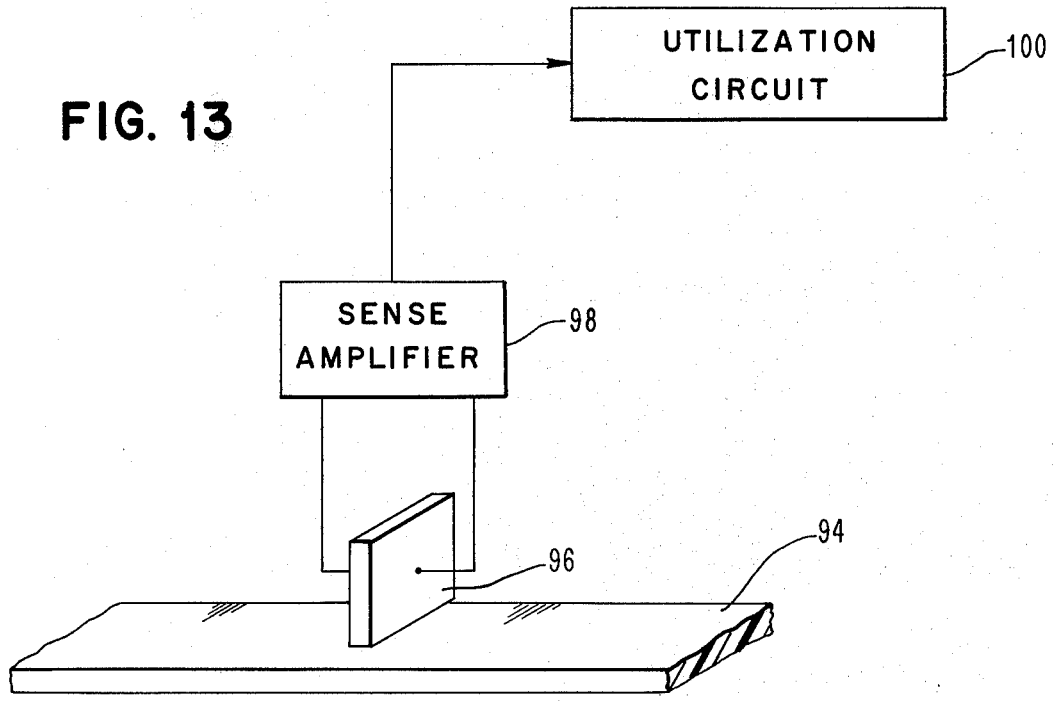
FIG. 13 is an illustration of a tape or disc information-handling system using the present amorphous magnetic material as the recording medium.

FIG. 13 shows a tape or disk recording medium 94 comprising amorphous magnetic film in accordance with the present invention, over which is located a read-write head 96. Transducer 96 is used to record information into magnetic domains in tape or disk 94 and to read the information stored therein, in a known manner. For this purpose, the electrical signals read from recording medium 94 are sent to sense amplifier 98 and then to utilization circuit 100, which could be any type of circuitry as is used in conventional computer technology.

The use of an amorphous film in accordance with FIG. 13 provides many advantages. The disk or tape substrates can be either flexible or rigid. This leads to utility in any type of information handling system. Additionally, the amorphous material is easily deposited on any type of substrate in a uniform manner to provide uniform magnetic properties throughout.

EXAMPLES

Amorphous magnetic compositions having uniaxial anisotropy have been prepared using sputtering (DC and RF) and electron beam evaporation. In general, films have been produced having amorphous characteristics as determined by electron beam diffraction techniques, among others. Magnetic anisotropies have been produced which were parallel to the plane of the film and perpendicular to the plane of the film.

I. Electron Beam Evaporated Films

In this method of film preparation, a polycrystalline target is first prepared using conventional techniques. For instance, small pieces of the constituents to be used in the target are melted in an inert gas atmosphere, using for example argon. Melting occurs on a water cooled copper hearth in a standard commercial arc furnace. The temperature is raised to the melting temperature of the constituents to form an arc melted ingot. Generally this is a polycrystalline target. In the laboratory, samples have been prepared from targets of arc melted $GdCo_5$.

After this, the target is placed in an ultra-high vacuum evaporator having a base pressure approximately $10^{-9}$ Torr. The ingot is placed in a water cooled copper hearth and is heated by an electron beam provided from an electron gun in the evaporator. Accelerating voltages of approximately 10 KV are used together with beam currents of approximately 100 milliamps.

The substrates used to deposit these films are arbitrarily chosen, and substrates such as glass, polished fused quartz, rock salt, and sapphire have been used successfully. The substrates are cooled with liquid nitrogen and have a temperature of approximately 100°K during the evaporation. The deposition rate was generally about 30A per second.

In one example, films were produced having thicknesses of 400A and 4000A. These films were Gd-Co alloys which were shown to be amorphous by electron beam diffraction. The atoms of the depositing materials striking the substrate approached at a glancing angle (any non-90° angle to the substrate plane) in order to provide the uniaxial anisotropy previously discussed. Perpendicular domains are seen in this film.

In another film deposition, the substrate temperature was 273°K. The same substrates were used and additionally $BaTiO_3$ substrates and cleaved mica substrates were used. The target composition ($GdCo_5$) was the same as that used for the 400A and 4000A films of the previous paragraph. Only the substrate temperature was changed in this deposition. In this case the film had crystallites located in a generally amorphous matrix, which indicates that the substrate temperature is critical in an electron beam deposition fabrication process. To provide substantially amorphous films, the substrate temperature has to be lowered from 273°K.

In another electron beam deposition, the target was $GdCo_2$ and the substrate was liquid nitrogen cooled. The film produced was amorphous having a uniaxial magnetization in the plane of the film. It appeared that the magnetization $M_s$ of this composition was too high so that the ratio $H_{A/4\ M}$ was not precisely correct for support of domains having perpendicular magnetization.

II. Sputtered Films

Many amorphous films have been produced by DC and RF sputtering, at various values for the sputtering parameters. These films exhibited perpendicular magnetic anisotropy and parallel magnetic anisotropy and were unaxial. Many values of magnetization and other magnetic parameters were obtained, in accordance with the principles outlined previously in the specification.

The following tables will describe the sputtering conditions and film data for various samples of amorphous magnetic films in accordance with the present invention. For the films produced from a target of $GdCo_5$, additional tables will be presented describing the actual sputtering process in more detail to more fully illustrate how to form these amorphous films. Since pre-sputtering steps and sputter cleaning steps are generally used before the actual deposition by sputtering, details concerning the sputtering process for the $GdCo_5$ target will sufficiently illustrate the principles involved for sputtering of films from other target compositions.

In these tables, DC sputtering was used if the "anode-cathode voltage" is a non-zero number. If this quantity is zero, RF sputtering was used. For RF sputtering, the power in watts and power density in watts/in.$^2$ is indicated, while for DC sputtering the current in ma. and the current density in ma/in.$^2$ is indicated.

Further, the DC sputtered samples have been metal coated on the back of the substrate for electrical contact during sputtering. Additionally, all substrates were galliumbacked to a water cooled or liquid $N_2$ cooled metal block. The liquid gallium interface between the substrate and the metal block provided uniform heat distribution.

In these sputtering processes, the anode-cathode spacing usually varied between about 1 inch and 1¼ inches, but can be varied from this as will be appreciated by one of skill in the art. The quantity "atomic ratio Co/Gd" was determined by any of the following methods: alpha particle back scattering, electron beam microprobe analysis, and x-ray fluorescent analysis.

In the tables for the details of the sputtering process pertaining to films produced from the $GdCo_5$ target, pre-sputtering and sputter cleaning steps are used before the actual sputter deposition. The pre-sputtering step is a getter cleaning of the system in which the target is cleaned. Sputtering occurs from the target and target atoms are deposited throughout the sputter apparatus. However, the substrates are covered by a shutter during this cleaning and the target atoms will not deposit on the substrate.

During the sputter cleaning step, the surface of the substrate is cleaned by sputtering between a shutter and the substrate, where the shutter is located in front of and blocks the target. The shutter has a ground potential while approximately 120 volts negative is placed on the substrate. This cleans the top surface of the substrate for subsequent deposition. During the actual sputter deposition, the shutters are removed and sputtering occurs between the target and the substrate.

During the sputtering process, the effect of magnetic fields having components perpendicular to the planes of the substrate and the target was tested. It was found that the magnetic field will change the deposition rate somewhat by making the plasma more dense, but will not have a substantial impact on the magnetic properties of the deposited films.

SPUTTERING DATA

| Target | Film | RF Power (watts)or DC Current (ma) | Anode-Cathode Voltage | Bias Voltage | Initial Pressure ×10⁻⁸(Torr) | Operating Pressure (μ) | Cathode Diameter (in.) | Deposit. Time (min.) | Sub. Temp. (C°) | RF Power Density (watts/in²) or DC Current Density (ma/in²) |
|---|---|---|---|---|---|---|---|---|---|---|
| $GdCo_5$ | Gd-Co 47 | 200 | 0 | 0 | 7.8 | 25 | 3 | 25 | 20 | 28 |
| | Gd-Co 52 | 200 | 0 | 0 | 8.0 | 21 | 3 | 24 | 20 | 28 |
| | Gd-Co 54 | 200 | 0 | 35 | 9.0 | 22 | 3 | 30 | 20 | 28 |
| | Gd-Co 56 | 200 | 0 | 100 | 14 | 24 | 3 | 45 | 20 | 28 |
| | Gd-Co 62 | 45 | 2000 | 50 | 10 | 81 | 3 | 25 | 20 | 6 |
| | Gd-Co 63 | 110 | 2000 | 50 | 5.6 | 68 | 4 | 35 | 20 | 9 |
| | Gd-Co 67 | 69 | 2000 | 50 | 11 | 67 | 4 | 37 | 20 | 5 |
| | Gd-Co 69 | 60 | 2000 | 50 | 5.6 | 72 | 4 | 170 | 20 | 5 |
| | Gd-Co 70 | 42 | 2000 | 25 | 14 | 66 | 4 | 30 | 20 | 3 |
| | Gd-Co 71 | 65 | 2000 | 75 | 30 | 54 | 4 | 20 | 20 | 5 |
| | Gd-Co 73 | 90 | 2000 | 100 | 11 | 64 | 4 | 20 | 20 | 7 |
| | Gd-Co 74 | 115 | 2000 | 150 | 8.7 | 71 | 4 | 15 | 20 | 9 |
| | Gd-Co 76 | 350 | 0 | 0 | 6.8 | 25 | 4 | 25 | 20 | 28 |
| $GdCo_2$ | Gd-Co 91 | 200 | 0 | 100 | 13 | 22 | 4 | 30 | 20 | 16 |
| | Gd-Co 95 | 200 | 0 | 100 | 5.6 | 20 | 4 | 60 | 20 | 16 |
| | Gd-Co 96 | 200 | 0 | 85 | 3.2 | 19 | 4 | 140 | 20 | 16 |

-continued

SPUTTERING DATA

| Target | Film | RF Power (watts) or DC Current (ma) | Anode-Cathode Voltage | Bias Voltage | Initial Pressure ×10⁻⁸(Torr) | Operating Pressure (μ) | Cathode Diameter (in.) | Deposit. Time (min.) | Sub. Temp. (C°) | RF Power Density (watts/in²) or DC Current Density (ma/in²) |
|---|---|---|---|---|---|---|---|---|---|---|
| GdFe₄ | Gd-Fe 1 | 200 | 0 | 0 | 7.1 | 19 | 4 | 30 | 20 | 16 |
|  | Gd-Fe 2 | 200 | 0 | 0 | 6.6 | 17 | 4 | 30 | 20 | 16 |
|  | Gd-Fe 4 | 45 | 2000 | 50 | 6.3 | 79 | 4 | 42 | 20 | 4 |

FILM DATA

| Film | Atomic Ratio Co/Gd | $4\pi M_s$(Oe) | Thickness(Å) | Resistance ohms/sq. | Zero Field Strip Width (μ) | Charact. length $l(\mu m)$ | Deposition Rate(Å/sec) | Anisotropy |
|---|---|---|---|---|---|---|---|---|
| Gd-Co 47 | 6.53 | 4900 | 5263 |  |  | 0.1 | 3.51 | normal to plane, small amt. paralle plane |
| Gd-Co 52 | 5.52 |  | 8471 |  |  |  | 5.88 | in plane |
| Gd-Co 54 | 5.94 |  | 9000 |  |  |  | 5.00 |  |
| Gd-Co 56 | 10.04 | 8000 | 3500 |  |  |  | 1.30 | in plane |
| Gd-Co 62 | 4.54 |  | 7964 |  | 0.75 | 0.08 | 5.31 | normal to plane, 1% N₂ |
| Gd-Co 63 | 3.68 | 3500 | 16580 |  | 4 | 0.53 | 7.90 | normal to plane |
| Gd-Co 67 | 4.17 |  | 15530 |  | 2.5 | 0.33 | 7.00 | normal to plane |
| Gd-Co 69 |  | 426 | 70000 |  | 5 | 0.49 | 6.90 | normal to plane |
| Gd-Co 70 | 4.74 |  | 8195 | 6.9300 | 0.80 | 0.09 | 4.55 | normal to plane |
| Gd-Co 71 | 4.96 |  | 7853 | 1.5500 |  |  | 6.54 | in plane |
| Gd-Co 73 | 5.67 |  | 12000 | 1.2000 | 1.8 | 0.24 | 10.00 | normal to plane |
| Gd-Co 74 | 6.53 | 4800 | 8400 | 1.6000 | 1.6 | 0.21 | 9.33 | normal to plane/in plane |
| Gd-Co 76 | 5.18 | 3800 | 12380 | 0.9760 |  |  | 8.25 | in plane |
| Gd-Co 91 | 3.34 |  | 5546 |  | 1.0 | 0.128 | 3.08 |  |
| Gd-Co 92 | 1.78 |  | 6110 |  | 10.0 | 1.30 | 1.70 |  |
| Gd-Co 96 | 3.0 |  | 28400 |  | 2.2 | 0.20 | 3.38 |  |
| Gd-Fe 1 |  |  | 10860 |  | 1.0 | 0.11 | 6.03 |  |
| Gd-Fe 2 |  |  | 5140 |  | 0.83 | 0.105 | 2.86 |  |
| Gd-Fe 4 |  |  | 12058 |  | 1.7 | 0.211 | 4.78 |  |

DETAILED SPUTTERING CONDITIONS (GdCo₅ TARGET)

|  |  | Presputter | Sputter Clean | Sputter |
|---|---|---|---|---|
| Gd-Co 47 (substrates were Al₂O₃, SiO₂) | Incident Watts (RF) | 100 | 350 | 200 |
|  | Reflected Watts | 2 | 2 | 2 |
|  | Cathode Voltage | — | — | — |
|  | Bias Voltage | 0 | 120 | 75 |
|  | Initial Pressure Chamber (×10⁻⁸ Torr) | 7.8 | — | 7.8 |
|  | Initial Pressure Stack (×10⁻⁸ Torr) | 5 | — | — |
|  | Chamber pressure (μ) Argon | 25 | 22 | 25 |
|  | Cathode Diameter (in.) | 3 | 3 | 3 |
|  | Time (Min) | 30 | 10 | 25 |
|  | Temperature (°C) | 20 | 20 | 20 |
| Gd-Co 52 (substrates were SiO₂) | Incident Watts (RF) | 100 | 350 | 200 |
|  | Reflected Watts | 2 | 2 | 2 |
|  | Cathode Voltage | — | — | — |
|  | Bias Voltage | 0 | 120 | 0 |
|  | Initial Pressure Chamber (×10⁻⁸ Torr) | 8 | — | 8 |
|  | Initial Pressure Stack (×10⁻⁸ Torr) | 5 | — | — |
|  | Chamber Pressure (μ) Argon | 23 | 21 | 21 |
|  | Cathode Diameter (in.) | 3 | 3 | 3 |
|  | Time (Min) | 60 | 10 | 24 |
|  | Temperature (°C) | 20 | 20 | 20 |
| Gd-Co 54 (substrates were SiO₂) | Incident Watts (RF) | 100 | 350 | 200 |
|  | Reflected Watts | 2 | 2 | 0 |
|  | Cathode Voltage | — | — | — |
|  | Bias Voltage | 0 | 120 | 35 |
|  | Initial Pressure Chamber (×10⁻⁸ Torr) | — | — | — |
|  | Initial Pressure Stack (×10⁻⁸ Torr) | — | — | — |
|  | Chamber Pressure (μ) Argon | 23 | 22 | 22 |
|  | Cathode Diameter (in.) | 3 | 3 | 3 |
|  | Time (Min) | 60 | 4 | 30 |
|  | Temperature (°C) | 20 | 20 | 20 |
| Gd-Co 56 (substrates were SiO₂) | Incident Watts (RF) | 100 | 350 | 200 |
|  | Reflected Watts | 2 | 2 | 2 |
|  | Cathode Voltage | — | — | — |
|  | Bias Voltage | 0 | 120 | 100 |
|  | Initial Pressure Chamber (×10⁻⁸ Torr) | 14 | — | — |
|  | Initial Pressure Stack (×10⁻⁸ Torr) | — | — | — |
|  | Chamber Pressure (μ) Argon | 25 | 24 | 24 |
|  | Cathode Diameter (in.) | 3 | 3 | 3 |
|  | Time (Min) | 60 | 10 | 45 |

-continued
DETAILED SPUTTERING CONDITIONS (GdCo$_5$ TARGET)

| | | Presputter | Sputter Clean | Sputter |
|---|---|---|---|---|
| Gd-Co 62 (substrates were SiO$_2$) 1% N$_2$ added | Temperature (°C) | 20 | 20 | 20 |
| | Current (ma) DC | 30 | — | 45 |
| | Reflected Watts | — | — | — |
| | Cathode Voltage | 2000 | — | 2000 |
| | Bias Voltage | 0 | — | 50 |
| | Initial Pressure Chamber (×10$^{-8}$ Torr) | 10 | — | 10 |
| | Initial Pressure Stack (×10$^{-8}$ Torr) | — | — | — |
| | Chamber Pressure ($\mu$) Argon | 81 | — | 81 |
| | Cathode Diameter (in.) | 3 | — | 3 |
| | Time (Min) | 5 | — | 25 |
| Gd-Co 63 (substrates were Al$_2$O$_3$, SiO$_2$) | Temperature (°C) | 20 | — | 20 |
| | DC Current (ma) | 50 | — | 110 on cathode |
| | | | | 108 on anode |
| | Reflected Watts | — | — | — |
| | Cathode Voltage | 2000 | — | 2000 |
| | Bias Voltage | 0 | — | 50 |
| | Initial Pressure Chamber (×10$^{-8}$ Torr) | 5.6 | — | 5.6 |
| | Initial Pressure Stack (×10$^{-8}$ Torr) | — | — | — |
| | Chamber Pressure ($\mu$) Argon | 70 | — | 68 |
| | Cathode Diameter (in.) | 4 | — | 4 |
| | Time (Min) | 35 | — | 35 |
| Gd-Co 67 (substrates were Al$_2$O$_3$, SiO$_2$) | Temperature (°C) | 20 | — | 20 |
| | DC Current (ma) | 55 | — | 69 on cathode |
| | | | | 73 on anode |
| | Reflected Watts | — | — | — |
| | Cathode Voltage | 2000 | — | 2000 |
| | Bias Voltage | 0 | — | 50 |
| | Initial Pressure Chamber (×10$^{-8}$ Torr) | 11 | — | 11 |
| | Initial Pressure Stack (×10$^{-8}$ Torr) | — | — | — |
| | Chamber Pressure ($\mu$) Argon | 91 | — | 67 |
| | Cathode Diameter (in.) | 4 | — | 4 |
| | Time (Min) | 60 | — | 37 |
| Gd-Co 69 (substrates were Al$_2$O$_3$, SiO$_2$) | Temperature (°C) | 20 | — | 20 |
| | Current (ma) DC | 60 | — | 60 on cathode |
| | | | | 67 on anode |
| | Reflected Watts | — | — | — |
| | Cathode Voltage | 2000 | — | 2000 |
| | Bias Voltage | 0 | — | 50 (grounded first 20 sec |
| | Initial Pressure Chamber (×10$^{-8}$ Torr) | 9.3 and 5.6 | — | 5.6 |
| | Initial Pressure Stack (×10$^{-8}$ Torr) | — | — | — |
| | Chamber Pressure ($\mu$) Argon | 110 | — | 72 |
| | Cathode Diameter (in.) | 4 | — | 4 |
| | Time (Min) | 60 | — | 170 |
| Gd-Co 70 (substrates were SiO$_2$, Al$_2$O$_3$) | Temperature (°C) | 20 | — | 20 |
| | Current (ma) DC | 60 | — | 42 on cathode |
| | | | | 35 on anode |
| | Reflected Watts | — | — | — |
| | Cathode Voltage | 2000 | — | 2000 |
| | Bias Voltage | 0 | — | 25 |
| | Initial Pressure Chamber (×10$^{-8}$ Torr) | 14 | — | 14 |
| | Initial Pressure Stack (×10$^{-8}$ Torr) | — | — | — |
| | Chamber Pressure ($\mu$) Argon | 110 | — | 66 |
| | Cathode Diameter (in.) | 4 | — | 4 |
| | Time (Min) | 30 | — | 30 |
| Gd-Co 71 (substrates were SiO$_2$, sapphire) | Temperature (°C) | 20 | — | 20 |
| | DC Current (ma) | 60 | — | 65 |
| | Reflected Watts | — | — | — |
| | Cathode Voltage | 2000 | — | 2000 |
| | Bias Voltage | 0 | — | 75 |
| | Initial Pressure Chamber (×10$^{-8}$ Torr) | 30 | — | — |
| | Initial Pressure Stack (×10$^{-8}$ Torr) | 20 | — | — |
| | Chamber Pressure ($\mu$) Argon | 120 | — | 54 |
| | Cathode Diameter (in.) | 4 | — | 4 |
| | Time (Min) | 30 | — | 20 |
| Gd-Co 73 (substrates were quartz, Al$_2$O$_3$) | Temperature (°C) | 20 | — | 20 |
| | DC Current (ma) | 80 | — | 90 on cathode |
| | | | | 106 on anode |
| | Reflected Watts | — | — | — |
| | Cathode Voltage | 2000 | — | 2000 |
| | Bias Voltage | 0 | — | 100 |
| | Initial Pressure Chamber (×10$^{-8}$ Torr) | 11 | — | 11 |
| | Initial Pressure Stack (×10$^{-8}$ Torr) | — | — | — |
| | Chamber Pressure ($\mu$) Argon | 110 | — | 64 |
| | Cathode Diameter (in.) | 4 | — | 4 |
| | Time (Min) | 70 | — | 20 |
| Gd-Co 74 (substrates were SiO$_2$) | Temperature (°C) | 20 | — | 20 |
| | Current (ma) DC | 80 | — | 115 on cathode |
| | | | | 155 on anode |
| | Reflected Watts | — | — | — |
| | Cathode Voltage | 2000 | — | 2000 |
| | Bias Voltage | 0 | — | 150 |
| | Initial Pressure Chamber (×10$^{-8}$ Torr) | 8.7 | — | 8.7 |
| | Initial Pressure Stack (×19$^{-8}$ Torr) | — | — | — |
| | Chamber Pressure ($\mu$) Argon | 110 | — | 71 |
| | Cathode Diameter (in.) | 4 | — | 4 |
| | Time (Min) | 60 | — | 15 |
| | Temperature (°C) | 20 | — | 20 |

-continued

DETAILED SPUTTERING CONDITIONS (GdCo$_5$ TARGET)

| | | Presputter | Sputter Clean | Sputter |
|---|---|---|---|---|
| Gd-Co 76 (substrates were quartz, Al$_2$O$_3$) | Incident Watts (RF) | 100 | 350 | 350 |
| | Reflected Watts | 2 | 2 | 2 |
| | Cathode Voltage | — | — | — |
| | Bias Voltage | 0 | 120 | 0 |
| | Initial Pressure Chamber (×10$^{-8}$ Torr) | 6.8 | — | 6.8 |
| | Initial Pressure Stack (×10$^{-8}$ Torr) | — | — | — |
| | Chamber Pressure ($\mu$) Argon | 24 | 24 | 25 |
| | Cathode Diameter (in.) | 4 | 4 | 4 |
| | Time (Min) | 30 | 10 | 25 |
| | Temperature (°C) | 20 | 20 | 20 |

SUMMARY

What has been described is various apparatus using magnetic compositions exhibiting uniaxial magnetic anisotropy which has substantially amorphous structural properties. These compositions can be made in bulk or thin film form and the magnetic properties can be tailored over wide ranges. Additionally, many applications other than those presented here can be foreseen for these films, especially in view of the ease of adjustment of their properties and the wide compositional ranges possible. Because the stringent substrate requirements normally associated with crystal fabrication are not present here, these films can be used in any type of environment with any type of substrate.

It should be understood by those of skill in the art that the magnetic and/or structural properties of these films can be varied to a considerable extent and that techniques for doing this other than those described herein may be utilized. Additionally, other types of fabrication may be utilized in accordance with principles known in the art.

What is claimed is:

1. A magnetic domain system comprising:
a magnetic medium in which said domains exist, said medium being an amorphous magnetic material without long range atomic ordering having long range magnetic ordering and a magnetic uniaxial anisotropy which is not due to long range crystalline structure, and means for sensing said domains in said amorphous magnetic medium.

2. The system of claim 1, where said amorphous magnetic material contains an additive element selected from the group consisting essentially of O, N, C, and P.

3. The system of claim 1, where said amorphous magnetic medium is doped with elements present in an amount up to and including 50 atomic percent.

4. The system of claim 1, where said uniaxial anisotropy is pair-ordering anistropy.

5. The system of claim 1, where said amorphous magnetic material exists in a micro-crystalline structure having localized atomic ordering over distances of about 100 angstoms and less.

6. The system of claim 1, where said amorphous material has localized atomic ordering over a distance of about 25 angstroms and less.

7. The system of claim 1, where said uniaxial anistropy is substantially normal to the plane of said amorphous magnetic material.

8. The system of claim 1, where said amorphous magnetic material is comprised of a single element having a net magnetic moment.

9. The system of claim 8, where said element is selected from the group consisting of 4f, 5f, and 3d series of elements from the periodic table.

10. The system of claim 1, where said amorphous magnetic medium is comprised of a plurality of elements, at least one of which has an unpaired magnetic spin.

11. The system of claim 10, where said amorphous medium is comprised of a rare earth-transition metal amorphous alloy.

12. The system of claim 11, where said alloy is a Gd-Co alloy.

13. The system of claim 11, where said alloy is a Gd-Fe alloy.

14. The system of claim 10, where said amorphous magnetic medium includes an additive which couples antiferromagnetically to a magnetic atom in said amorphous medium.

15. The system of claim 10, where said amorphous magnetic medium includes an additive which couples ferromagnetically to a magnetic atom in said amorphous medium.

16. The system of claim 10, where said amorphous magnetic medium includes an additive which changes the atomic ordering of said amorphous magnetic medium relative to the wall width of domains therein.

17. The system of claim 10, where said amorphous medium is comprised of a ternary alloy which is magnetically ordered.

18. A magnetic system, comprising:
an amorphous magnetic medium having no long range atomic ordering and having long range magnetic ordering and magnetic uniaxial anistropy which is not due to long range crystalline structure, said medium having magnetic domains therein,
means for producing selected magnetization states of said domains, and
sensing means for sensing the magnetization state of said domains.

19. The system of claim 18, where said domains are magnetic bubble domains.

20. The system of claim 18, further including means for moving said amorphous magnetic medium.

21. The system of claim 18, where said amorphous medium is a sheet located on a substrate.

22. The system of claim 21, where said substrate is a flexible medium.

23. The system of claim 21, where said substrate is a rigid medium.

24. The system of claim 21, where said substrate is an insulator.

25. The system of claim 21, where said substrate is a metal.

26. The system of claim 21, where said substrate is a semiconductor.

27. The system of claim 21, where said substrate is silicon.

28. A light modulator, comprising:
a light source for providing a polarized light beam whose intensity is to be modulated,
an amorphous magnetic medium having no long range atomic ordering and having long range magnetic ordering and magnetic uniaxial anisotropy which is not due to long range crystalline structure located in the path of said light beam wherein the polarization of said light beam is rotated when said light beam strikes said amorphous medium,
means for producing selected magnetization states in said amorphous medium to controllably affect said rotation of the polarization of said light beam,
analyzing means responsive to said light beam after said beam has struck said amorphous magnetic medium, said analyzing means transmitting said light beam in accordance with the rotation of its polarization.

29. The modulator of claim 28, where said amorphous magnetic material is a rare earth-transition metal alloy.

30. The modulator of claim 29, where said alloy is selected from the group consisting essentially of Y-Co, La-Co, Ce-Co, Nd-Co, and Pr-Co amorphous alloys.

31. The modulator of claim 28, where said amorphous magnetic medium sustains magnetic bubble domains therein.

32. The modulator of claim 31, including means for producing said bubble domains at selected portions of said amorphous magnetic medium.

33. An article of manufacture useful as a permanent magnet, said article being an amorphous magnetic medium without long range atomic ordering, said medium having long range magnetic order and magnetic uniaxial anisotropy which is not due to long range crystalline structure, high magnetic moment $4\pi M_s$, high Curie temperature $T_c$, and high coercivity $H_c$.

34. The article of claim 33, where said amorphous medium is comprised of a multicomponent alloy.

35. The article of claim 34, where said alloy is comprised of Y-Co having therein an element from the group consisting essentially of O, N, and C.

36. A magnetic bubble domain system, comprising:
a magnetic sheet in which said bubble domains exist,
a permanent magnet located adjacent said magnetic sheet for providing a magnetic bias field in said sheet which is substantially normal to the plane of said sheet, said permanent magnet being comprised of an amorphous magnetic material having uniaxial anisotropy, and
means for manipulating said domains in said sheet.

37. The system of claim 36, where said magnetic sheet is an amorphous magnetic sheet having no long range atomic ordering and a uniaxial magnetic anisotropy which is not due to long range crystalline structure.

38. The system of claim 36, where said permanent magnet is a multicomponent alloy system.

39. A magnetic recording system, comprising:
an amorphous magnetic medium having no long range atomic ordering and having conduction electrons therein, said medium having long range magnetic order and uniaxial magnetic anisotropy which is not due to long range crystalline structure, said medium being capable of supporting magnetic domains therein,
writing means for producing selected magnetic states of domains in said amorphous magnetic material, and
sensing means for sensing the magnetization state of domains in said amorphous magnetic medium.

40. The system of claim 39, where said amorphous magnetic medium is comprised of substantially amorphous particles located in a binder.

41. The system of claim 39, where said amorphous magnetic material is comprised of microcrystalline regions having atomic ordering about 100 angstroms and less.

42. The apparatus of claim 39, including means for producing relative motion between at least two of said magnetic medium, said writing means, and said reading means.

43. The system of claim 39, where said amorphous magnetic material is a layer located on a substrate.

44. The system of claim 43, where said substrate is a disc.

45. The system of claim 43, where said substrate is a tape.

46. The system of claim 39, where said amorphous magnetic medium is comprised of a multicomponent alloy system.

47. The system of claim 46, where said alloy system is comprised of a rare earth-transition metal alloy.

48. The system of claim 47, having dopants therein for changing the atomic ordering of said amorphous magnetic medium relative to the width of said domain.

49. The system of claim 39, where said writing means and said reading means are located sufficiently close to said amorphous magnetic medium to be in magnetic coupling relationship to said domains therein.

50. The system of claim 49, further including means for providing the relative motion between said writing means and said reading means and said amorphous magnetic medium.

51. A magnetic apparatus, comprising:
an amorphous magnetic medium having no long range periodic atomic order, said medium having long range magnetic order and magnetic anisotropy which is not due to long range crystalline structure, said medium being capable of supporting different states of magnetization therein,
means for producing a selected magnetization state in said medium, and
means for sensing the magnetization state of said medium.

52. In a magnetic bubble domain apparatus having a magnetic medium in which said bubble domains exist and means for sensing said domains, said medium being comprised of an amorphous magnetic material exhibiting long range magnetic order and a magnetic uniaxial anisotropy which is not due to long range crystalline structure of the medium, said medium having an amorphous atomic structure without long range periodic atomic ordering.

53. In a magnetic bubble domain apparatus having writing means for producing said domains in a magnetic medium and means for sensing said domains, said magnetic medium being comprised of an amorphous magnetic material having long range magnetic order and magnetic uniaxial anistropy which is not due to long range crystalline structure, said medium being structurally amorphous and exhibiting no long range periodic atomic ordering.

54. A magnetic apparatus, comprising:
a magnetic medium in which a localized region can have a selected magnetization state, said medium being comprised of a structurally amorphous magnetic material without long range periodic atomic ordering and having magnetic anistropy which is not due to long range crystalline structure, and
writing means for producing said selected magnetization state in said localized region.

55. The apparatus of claim 54, in which said amorphous medium is a layer located on a substrate.

56. The apparatus of claim 54, wherein said amorphous magnetic medium is comprised of a plurality of elements, at least one of which has an unpaired magnetic spin.

57. The apparatus of claim 56, where said amorphous magnetic medium is comprised of a rare earth element and a transition metal element.

58. A magnetic apparatus, comprising;
a medium having an amorphous structure characterized by the absence of both long range periodic atomic ordering and long range crystalline structure, said amorphous medium having long range magnetic ordering and a magnetic uniaxial anistropy due to localized ordered clusters of atoms in said medium, said medium being capable of supporting different states of magnetization therein,
means for producing a selected magnetization state in said medium, and
means for sensing the magnetization state of said medium.

59. A magnetic apparatus comprising:
a magnetic medium having an amorphous structure characterized by the absence of both long range periodic atomic ordering and long range crystallinity, said medium having a magnetic anistropy due to phase separations in the medium, said medium being capable of supporting different states of magnetization therein,
means for producing a selected magnetization state in said medium, and
means for sensing the magnetization state of said medium.

60. A magnetic apparatus, comprising:
a magnetic medium having an amorphous structure characterized by the absence of both long range atomic order and long range crystallinity, said magnetic medium having long range magnetic ordering and unaxial magnetic anisotropy due to pair ordering of atoms in said magnetic medium, said medium being capable of supporting different states of magnetization therein,
means for producing a selected magnetization state in said medium, and
means for sensing the magnetization state of said medium.

61. A magnetic apparatus comprising:
a medium having an amorphous structure characterized by the absence of both long range periodic atomic ordering and long range crystallinity, said medium having long range magnetic ordering and a magnetic uniaxial anisotropy which is due to regions of different composition located adjacent to one another in said medium, said medium being capable of supporting different states of magnetization therein,
means for producing a selected magnetization state in said medium, and
means for sensing the magnetization state of said medium.

62. A magnetic apparatus, comprising:
a medium having an amorphous structure characterized by the absence of long range periodic atomic ordering and long range crystallinity, said medium having long range magnetic ordering and a magnetic uniaxial anisotropy which is due to shape anisotropy, said medium being capable of supporting different states of magnetization therein,
means for producing a selected magnetization state in said medium, and
means for sensing the magnetization state of said medium.

63. A magnetic apparatus, comprising:
a medium having an amorphous structure characterized by the absence of both long range periodic atomic ordering and long range crystallinity, said medium having long range magnetic order and a magnetic uniaxial anisotropy due to anisotropies in short range structural or compositional ordering, said medium being capable of supporting magnetic domains having different states of magnetization therein,
means for producing a selected magnetization state in said domains, and
means for sensing the magnetization state of said domains.

* * * * *

UNITED STATES PATENT OFFICE
CERTIFICATE OF CORRECTION

PATENT NO. : 3,965,463
DATED : June 22, 1976
INVENTOR(S) : Praveen Chaudhari et al.

It is certified that error appears in the above-identified patent and that said Letters Patent are hereby corrected as shown below:

Column 20, lines 51 & 52, "movement" should read --moment--.

Column 21, line 37, "movement" should read --moment--.

Column 23, line 28, "$H_{A/4\ M}$" should read -- $H_A/4\pi M_s$ --.

Signed and Sealed this

Twenty-third Day of November 1976

[SEAL]

Attest:

RUTH C. MASON
Attesting Officer

C. MARSHALL DANN
Commissioner of Patents and Trademarks